United States Patent [19]
Stewart et al.

[11] Patent Number: 5,812,557
[45] Date of Patent: Sep. 22, 1998

[54] POWER LINE COMMUNICATIONS ANALYZER

[75] Inventors: J. Marcus Stewart, San Jose; Glen M. Riley, Los Gatos; Philip H. Sutterlin, San Jose; Marie E. Andrus, Los Gatos; Amy O. Hurlbut, San Francisco; Milton T. Tormey, Los Altos, all of Calif.

[73] Assignee: Echelon Corporation, Palo Alto, Calif.

[21] Appl. No.: 926,586

[22] Filed: Sep. 4, 1997

Related U.S. Application Data

[63] Continuation of Ser. No. 667,328, Jun. 20, 1996, abandoned, which is a continuation of Ser. No. 548,778, Oct. 26, 1995, abandoned, which is a continuation of Ser. No. 41,567, Apr. 2, 1993, abandoned.

[51] Int. Cl.⁶ ..................................................... G06F 11/00
[52] U.S. Cl. ........................ 371/20.1; 371/5.5; 370/252; 370/317; 370/318; 375/254
[58] Field of Search ..................................... 371/20.1, 5.5, 371/64, 5.1, 2.1; 370/252, 317, 318; 375/254

[56] References Cited

U.S. PATENT DOCUMENTS

| 4,525,789 | 7/1985 | Kemper et al. ......................... 364/481 |
| 4,554,656 | 11/1985 | Budnikis et al. ......................... 370/85 |
| 4,689,760 | 8/1987 | Lee et al. ............................. 370/110.3 |
| 4,829,554 | 5/1989 | Barnes et al. ............................. 379/58 |
| 4,918,690 | 4/1990 | Markkula, Jr. et al. ................... 370/94 |
| 4,941,143 | 7/1990 | Twitty et al. ........................... 370/85.2 |
| 4,947,459 | 8/1990 | Nelson et al. ........................... 455/612 |
| 5,103,461 | 4/1992 | Tymes ......................................... 371/1 |
| 5,281,810 | 1/1994 | Fooks et al. ......................... 250/222.1 |
| 5,336,882 | 8/1994 | Fooks et al. ............................. 250/221 |

FOREIGN PATENT DOCUMENTS

| 3441644 | 5/1986 | Germany . |
| 9418637 | 8/1994 | WIPO . |

*Primary Examiner*—Phung M. Chung
*Attorney, Agent, or Firm*—Blakely, Sokoloff, Taylor & Zafman LLP

[57] ABSTRACT

A power line communications analyzer (PLCA) provides a signal strength metering system and selectable signal attenuation functions for adjusting the transmitting unit's attenuation and measuring error rate without the need for a user to be present at both the sending and receiving locations under test. Each PLCA is coupled to a power line communication network via an electrical outlet and power lines. In actual operation, one of the PLCAs acts as a data transmitter and the other PLCA acts as a data receiver. The mode of operation of the PLCA can be dynamically altered during operation of the system. The PLCA comprises control logic that receives command inputs from a keypad, generates data packets for transmission on the power line communication network, receives and analyzes data packets received from the power line communication network, detects the power line signal and/or noise level and drives the LED display accordingly, and displays packet transmission information on an LCD display.

7 Claims, 26 Drawing Sheets

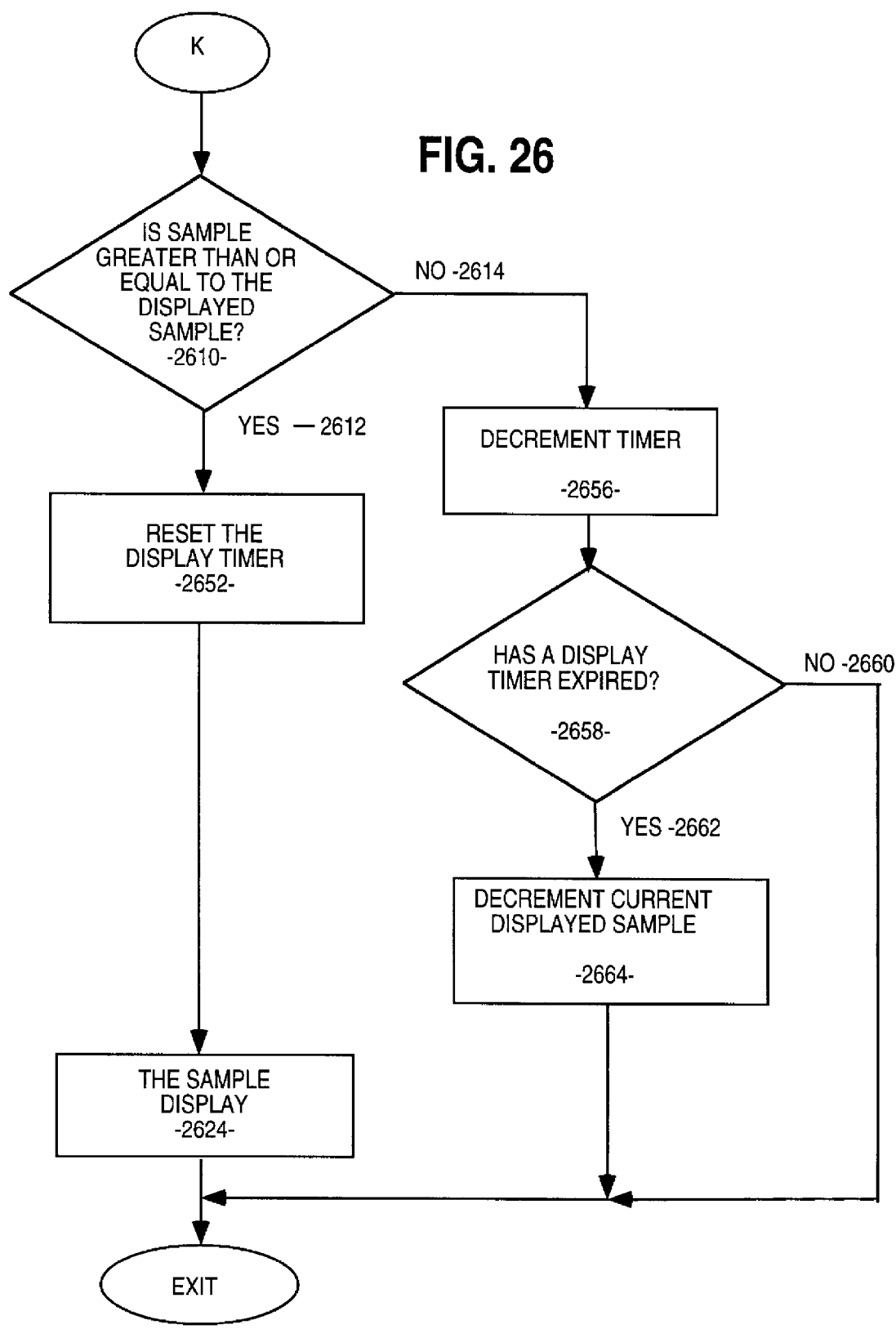

POWER LINE COMMUNICATIONS ANALYZER

This is a continuation of application Ser. No. 08/667,328, filed Jun. 20, 1996 now abandoned, which is a continuation of application Ser. No. 08/548,778, filed Oct. 26, 1995, now abandoned which is a continuation of application Ser. No. 08/041,567, filed Apr. 2, 1993, now abandoned.

BACKGROUND OF THE INVENTION

1. Field of the Invention

The present invention relates to the field of power line communications systems. Specifically, the present invention relates to test equipment or devices for analyzing the transfer of information on a power line communications system.

2. Description of Related Art

Power line communications systems may use alternating current (AC) or direct current (DC) power lines for the purpose of communication between electronic devices attached through the power lines. Use of existing power lines as a communication medium eliminates installation costs for adding dedicated communication wiring to existing structures. Power line communication is difficult to implement because of the adverse environment in which power line communication must take place. A typical AC power line network is used for power distribution to a number of electric devices connected thereto. Each of a variety of types of devices can conduct a significant level of noise back onto the power line. Different devices produce different types and degrees of noise that may impede the flow of information over the power line. Noise on the power line may impair the proper and reliable operation of a power line communications system.

Another problem potentially hindering a power line communications system is signal attenuation. Due in part to the diverse impedance levels of the electric devices being used with a power line network, transmitted communication signals may suffer greater than 40 dB of attenuation before being captured by a receiver. This significant attenuation problem in combination with the noise problem renders effective communication very difficult. One example of a power line communications system is a system manufactured by Echelon Corporation of Palo Alto, Calif.

The noise and attenuation problems existing in a particular power line network may vary substantially from one network to another depending upon on the types of devices attached to the power line network. Further, even the mode of operation of particular devices on the power line network may differentially affect the noise or attenuation levels on the power line network. For this reason, it is desirable to perform an analysis of a power line network to determine noise levels, attenuation levels, and the capacity of the network to efficiently and accurately transfer information from a transmitting node to a receiving node on the power line network.

There are three particular problems not addressed by prior art systems. One particular problem in power line analysis is the determination and display of the level of only the types of noise which impair a power line communication system. A power line communication system has noise sensitivities which vary as a function of frequency. For a noise display to provide a useful measure of the level of communication impairment in a particular network, the display should have similar sensitivity versus frequency characteristics to that of a communication receiver. As another example, the same level of noise may impair communication to varying degrees depending on whether the noise is more continuous or impulsive in nature. Again, the display's sensitivity to various noise types should be similar to the communication receiver's sensitivity to impairment by these noise types. Once a proper determination of noise has been made, a measure of receive signal strength is also needed so that the signal to noise ratio (S/N) and operating margin (receive signal in excess of that required for reliable communication) can be determined.

A second problem in power line analysis is that a degraded signal to noise ratio is not the only cause for impaired power line communication. Power line impedances in conjunction with the impedances of devices connected to the power line can produce a frequency and phase response (between a communication transmitter and receiver) which distorts the shape of the transmitted signal in a way that impairs communication. For this type of impairment, characterization of operating margin requires transmission of attenuated signals followed by measurement of error rate at the receiver. The maximum level of transmit attenuation which still results in an acceptable error rate becomes a measure of operating margin. Note that this second measure of operating margin encompasses all effects of power line noise, attenuation and distortion. By using the second measure of operating margin in conjunction with the previous determination of signal to noise ratio, one can determine the dominant impairment. Knowledge of which impairment is dominant then leads to a determination of proper corrective action, if required.

A third problem in power line analysis is the desire for one person or user to be able to perform the analysis without having to be present at both units under test. Inter-unit communication of parameters such as error rate and transmit attenuation would solve this problem as long as a means is provided for these messages to be communicated in the presence of highly impaired conditions.

Thus, a power line communication analyzer having these features is needed.

SUMMARY OF THE INVENTION

The present invention is a power line communications analyzer providing a signal strength metering system and selectable signal attenuation functions and a means for adjusting the transmitting unit's attenuation and measuring error rate without the need for a user to be present at both the sending and receiving locations under test.

In a typical configuration of the present invention, a conventional power line communications network is linked with two power line communications analyzers (PLCAs). The PLCAs analyze and report the reliability of the power line communication link between any two points in a particular power line communication network. By analyzing the transfer of data across the network, the suitability of a particular network for the transmission of data can be determined. Further, modifications or enhancements to the network may be made to improve the quality of data transmission.

Each PLCA is coupled to the network via an electrical outlet and power lines. In actual operation, one of the PLCAs acts as a data transmitter and the other PLCA acts as a data receiver. The mode of operation of the PLCA can be dynamically altered during operation of the system.

The internal structure of the power line communication analyzer comprises control logic which includes hardware and/or firmware for controlling the operation of the PLCA. In general, the control logic receives command inputs from a keypad, generates data packets for transmission on the power line communication network, receives and analyzes data packets received from the power line communication network, detects the power line signal and/or noise level and drives the LED display accordingly, and displays packet transmission information on an LCD display.

The design and operation of the present invention will be disclosed in detail in the following detailed description of the preferred embodiment.

BRIEF DESCRIPTION OF THE DRAWINGS

FIGS. 5–26 are flowcharts of the control logic used in the preferred embodiment.

DETAILED DESCRIPTION OF THE PREFERRED EMBODIMENT

The present invention is a power line communications analyzer providing a signal strength metering system and selectable signal attenuation functions and a means for adjusting the transmitting unit's attenuation and measuring error rate without the need for a user to be present at both the sending and receiving locations under test. In the following detailed description, numerous specific details are set forth in order to provide a thorough understanding of the present invention. However, it will be apparent to one of ordinary skill in the art that these specific details need not be used to practice the present invention. In other circumstances, well known structures, materials, circuits, and interfaces have not been shown or described in detail in order not to unnecessarily obscure the present invention.

Figure 1:
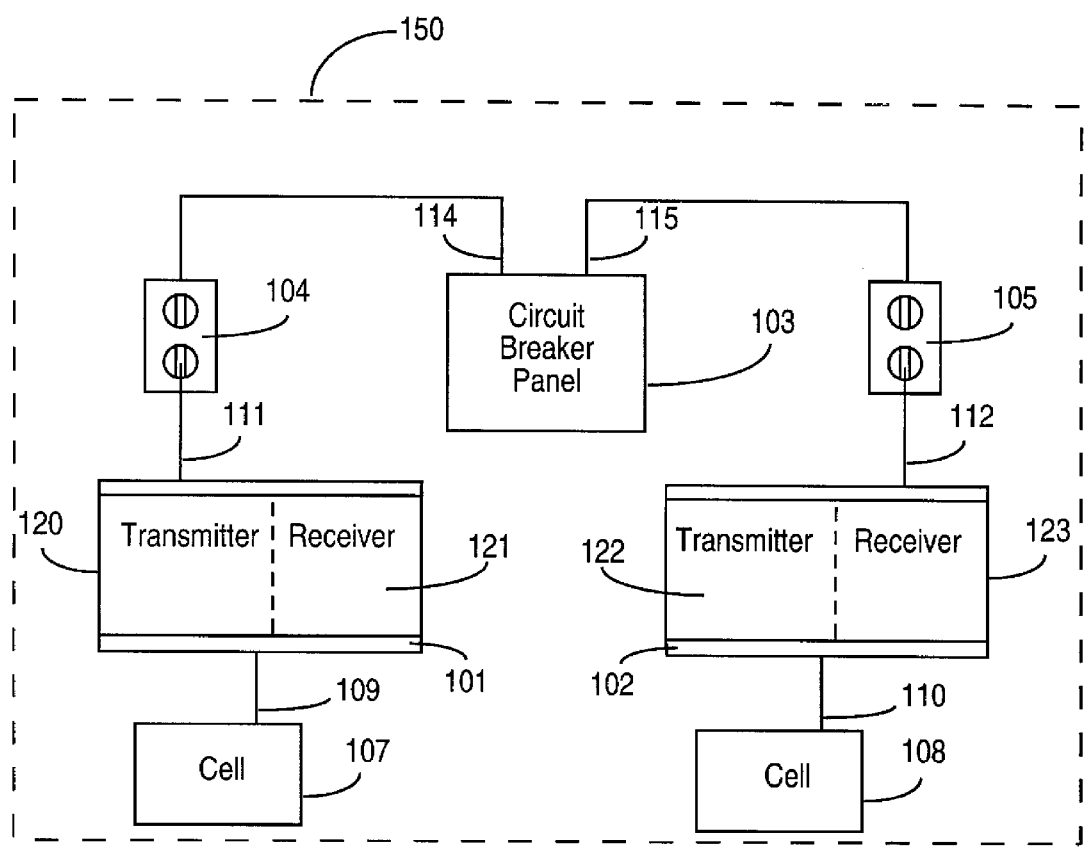
FIG. 1 illustrates a conventional power line communications network.

Referring to FIG. 1, a typical power line distribution network 150 is shown. The simplified power distribution network shown in FIG. 1 is typical of those present in most industrial, business, and residential structures. In general, such systems include a circuit breaker panel 103 to which a plurality of power lines 114 and 115 are coupled. Typical electrical outlets 104 and 105 may also be connected to power lines 114 and 115. This power distribution network is typically used to distribute 50 or 60 Hz AC power; although, in some cases higher frequencies are used such as 400 Hz in aircraft or lower frequencies such as 25 Hz or DC in some rail systems. Many different types of electric devices may be coupled to a power distribution network 150 such as the one shown in FIG. 1.

The power distribution network 150 shown in FIG. 1 may be used as a communications medium as well as a power distribution means. Thus, data may be transferred from one location on the power distribution network to another location via lines 114 and/or 115. In order to provide the data communications capability, a transmitter/receiver (i.e. transceiver) 101 and 102 is provided. Transceiver 101 is shown coupled to outlet 104 via line 111 and transceiver 102 is shown coupled to outlet 105 via line 112. Thus, data may be transferred from transceiver 101 across lines 111 and 114 through circuit panel 103 into transceiver 102 via lines 115 and 112. Transceiver 101 and 102 may also be coupled with cells 107 and 108. Cells 107 and 108 are data processing devices such as the apparatus described in U.S. Pat. No. 4,941,143 or other data device. The cell or other device 107 may be coupled to transceiver 101 in order to supply data for transmission across the power distribution network. Similarly, a cell or other device 108 may be coupled to a transceiver 102 in order to receive the data transmitted by transmitter 120. It will be apparent to those of ordinary skill in the art that a cell does not necessarily need to be used as a data source or a data sink. Other types of sources for digital data may be coupled to transceivers 101 and 102. Similarly, a processor may be included within transceivers 101 and 102. In addition, it will be apparent to those of ordinary skill in the art that transceiver 101 does not necessarily need to be coupled to an outlet receptacle 104 such as that illustrated in FIG. 1. For example, transceiver 101 may be embedded within receptacle 104 in order to transmit and/or receive data via power line 114. It should also be noted that transceiver 101 is identical in structure and function to transceiver 102 as shown in FIG. 1. Power line communication transceivers such as transceiver 101 and 102 are manufactured by Echelon Corporation of Palo Alto, Calif.

There are numerous sources of noise and other transient signals associated with power line distribution systems that make it difficult to receive and/or reconstruct signals from a power line communications transmitter. For instance, light dimmers produce a substantial degree of noise on the power line distribution network. Other sources of noise include television sets, computers, electric motors, and numerous other types of electronic or electric devices. The wire inductance and loading effects of the impedance of devices plugged into the power line distribution network can easily result in the attenuation of a transmitted signal by 40 dB to 60 dB. Worse yet, the electrical characteristics of the power line distribution network vary from instant to instant, thereby presenting a continuously changing communication medium. Consequently, transceivers 101 and 102 must be able to transmit and receive data over the power line distribution network in spite of the existing ambient noise on the network.

Spread spectrum signaling is one of the best methods of communicating via the power line because of its ability to overcome power line noise. Ideally, spread spectrum transmission distributes a signal over the widest possible bandwidth for optimum performance in the face of electrical noise. Bandwidth limits for power line signaling in the United States are set by the Federal Communications Commission (FCC). Because the FCC has mandated that power line signals not interfere with AM radios operating down to 535 kHz, the practical upper limit is 450 kHz. A lower bandwidth limit below 100 kHz offers little performance advantage, because power line noise increases dramatically below this frequency. To use the greatest portion of this 350 kHz wide band, a modified direct sequence spread spectrum and coding technique with a bit rate of 10 kilobits per second may be used in a conventional power line distribution network as illustrated in FIG. 1. A power line communications system using this spread spectrum and coding technique is manufactured by Echelon Corporation of Palo Alto, Calif.

The response time of a control network, such as the power line communication network illustrated in FIG. 1, is the speed at which the network can react to a change in the status of a sensor or output device coupled to the network or to an operator directive issued over the network. Changes in the status of sensors, actuators, displays, or controllers coupled to the network are broadcast as packets of data bits. A data packet generally includes the address of the sending and receiving transceivers, command signals, and error detection information. Each transceiver 101 and 102 in the conventional power line distribution communications network comprises a NEURON® chip and a power line transceiver (PLT). Both the transceiver and the NEURON® chip integrated circuit are available from Echelon Corporation of Palo Alto, Calif. Further, the NEURON® chip and the corresponding power line communication network in which they operate are the subject of U.S. Pat. No. 4,918,690 issued Apr. 17, 1990, invented by Armas C. Markkula et al., and assigned to Echelon Corporation of Palo Alto, Calif.

The NEURON® chip is optimized for formatting and decoding data packets for transmission or reception over the power line communications network. The NEURON® chip works in concert with the PLT to deliver between 55 and 60 data packets per second for typical applications. The system response time depends on how fast the data packets can be formatted by the sender, broadcast over the power line communication network, and then decoded by the receiver. It will be apparent to those of ordinary skill in the art that other embodiments of a conventional power line communications network may employ different types of control circuits; however, in all cases a transmitter must be provided for encoding data packets and a receiver must be provided for decoding data packets transferred across the power line communications network. The apparatus and methods disclosed in the above-referenced patent provide a means for handling the actual transmission and delivery of a data packet across the network.

Every power line communications network has its own unique set of impediments to reliable power line communications. Therefore, it is important to be able to evaluate a potential installation for suitability before installing the actual communications control system.

Figure 2:
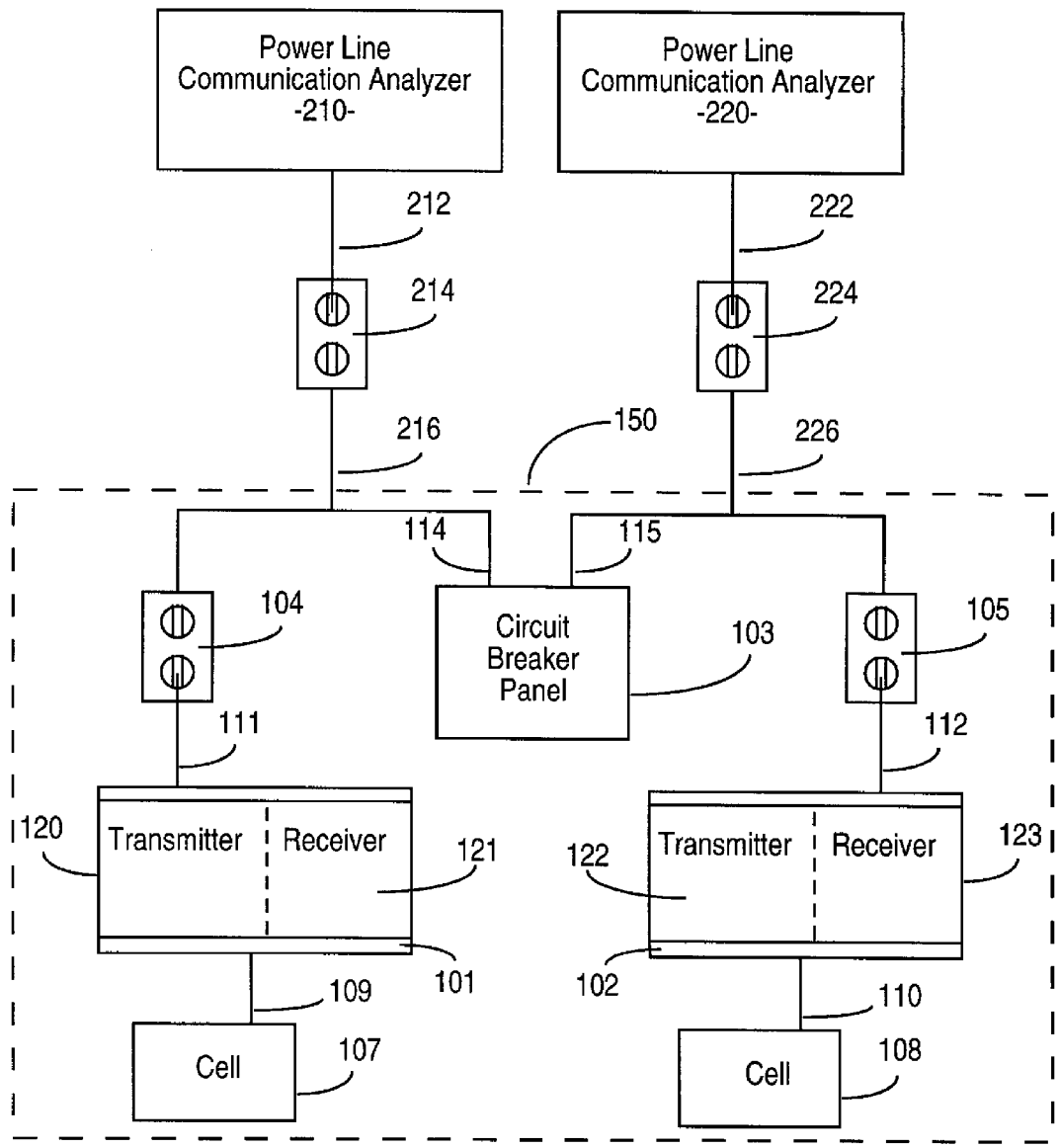
FIG. 2 illustrates the power line network coupled with two power line communications analyzers (PLCA) of the present invention.

Referring now to FIG. 2, the conventional power line communications network 150 is linked with two power line communications analyzers (PLCA) 210 and 220. The PLCAs analyze and report the reliability of the power line communication link between any two points in a particular power line communication network. By analyzing the transfer of data across network 150, the suitability of a particular network for the transmission of data can be determined. Further, modifications or enhancements to the network may be made to improve the quality of data transmission. PLCA 210 is coupled to network 150 via outlet 214 and lines 212 and 216. PLCA 220 is coupled to network 150 via outlet 224 and lines 222 and 226. It will be apparent to one of ordinary skill in the art that PLCA 210 and 220 may be coupled to network 150 in any way provided for the connection of transceiver 101 or transceiver 102 to network 150. In actual operation, one of the PLCAs (i.e. 210 or 220) acts as a data transmitter and the other PLCA acts as a data receiver. The mode of operation of the PLCA can be dynamically altered during operation of the system. The design and operation of PLCA 210 and 220 forms the substance of the invention claimed herein and is described in detail in the following sections.

Figure 3:
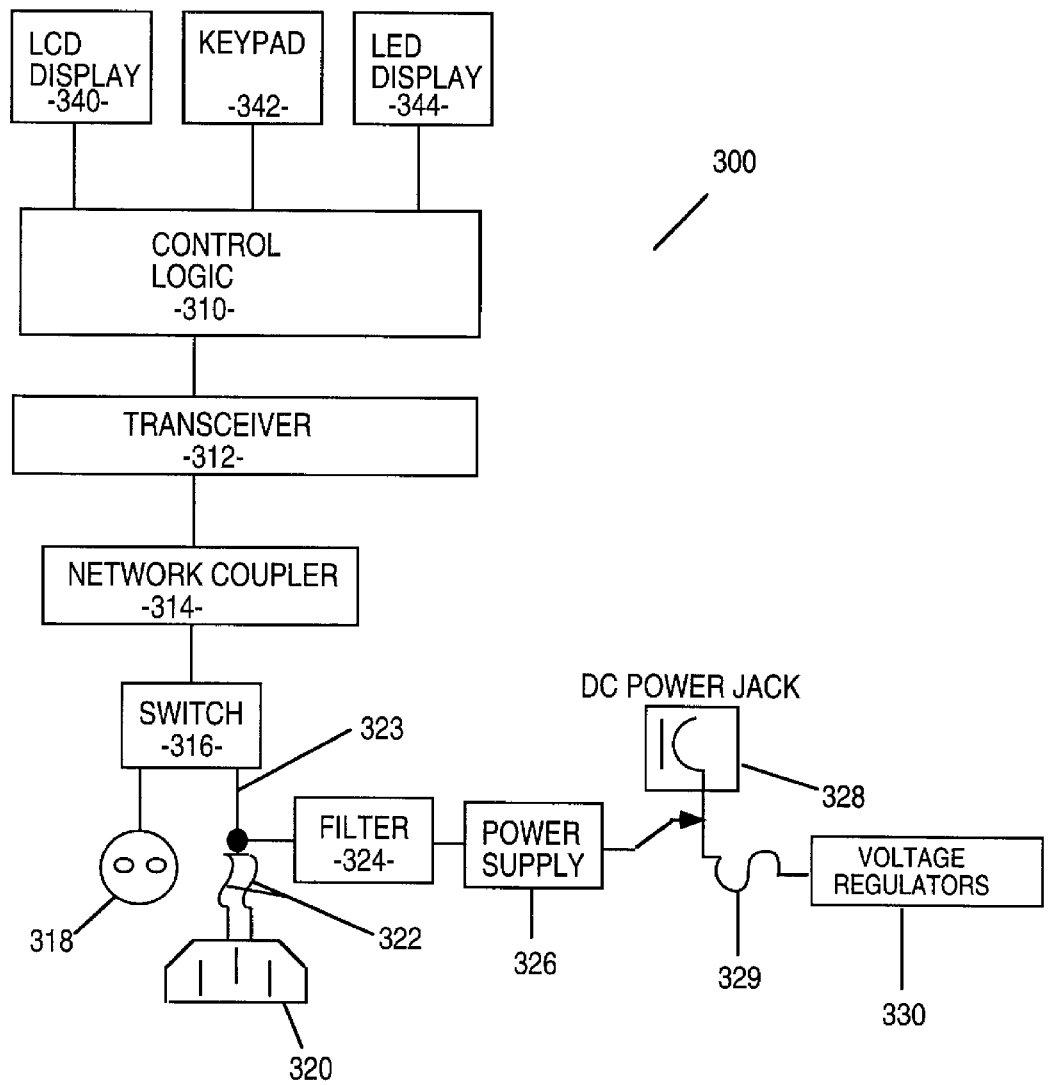
FIG. 3 illustrates the internal structure of the PLCA of the preferred embodiment.

Referring to FIG. 3, the internal structure of the power line communication analyzer 300 of the preferred embodiment is illustrated. PLCA 300 comprises control logic 310 which includes hardware and/or firmware for controlling the operation of the PLCA 300. In general, control logic 310 receives command inputs from keypad 342, generates data packets for transmission on power line communication network 150, receives and analyzes data packets received from power line communication network 150, detects the power line signal and/or noise level and drives the LED display accordingly, and displays packet transmission information on LCD display 340. The design and operation of control logic 310 will be described in detail in connection with the flowcharts of FIGS. 5 through 26. It will be apparent to one of ordinary skill in the art having read the detailed description of the invention provided herein that control logic 310 may be implemented using standard gate array logic, discrete logic, or software processing logic stored in a read-only memory (ROM) device.

Control logic 310 is coupled to transceiver 312 as illustrated in FIG. 3. Transceiver 312 comprises logic and circuitry substantially identical to transceivers 101 and 102 illustrated in FIGS. 1 and 2. A transceiver such as transceiver 312 is manufactured and distributed by Echelon Corporation of Palo Alto, Calif.

In general, transceiver 312 receives data packets and control information from control logic 310. The data packets so received by transceiver 312 are formatted for transfer on power line communication network 150. Similarly, transceiver 312 receives data packets sent by a different PLCA device across network 150. The data packets received over network 150 by transceiver 312 are transferred to control logic 310 for decoding. The particular protocol and methods for transmitting and receiving data packets on network 150 are well known as implemented in a transceiver manufactured by Echelon Corporation.

In support of the power line communication analyzer 300, control logic 310 is coupled to LED display 344. The control logic includes digital filtering to cause the display to reject power line noise in a similar fashion to the transceiver. It also includes logic to lengthen brief events to provide a visual indication on the appropriate LEDs. LED display 344 comprises LED decoders and drivers for driving a set of signal level LEDs and three status indicators in the preferred embodiment. The signal level LEDs comprise a set of ten green LED indicators in the preferred embodiment that indicate the relative signal strength being received by the PLCA 300 in the carrier band. In the preferred embodiment, these LEDs each have ratings of −42, −36, −30, −24, −18, −12, −9, −6, −3, and 0 dB, relative to 5 Vp-p of signal on the power line 150. These LEDs are useful for displaying a quick estimate of the signal (while packets are present) to noise (while no packets are present) ratio on network 150 at any particular time. The three status indicators comprise a carrier detect LED, a packet detect LED, and an error correction LED. The carrier detect LED comprises a yellow LED flashing on for 50 milliseconds whenever transceiver 312 detects a signal that breaks the correlation threshold. This LED gives a rough visual indication of the density of carrier-like signals present on network 150 (either from valid packets or from noise with characteristics similar to a valid transmission). The packet detect LED is a green LED indicator that indicates the detection of a valid data packet as received by transceiver 312. This LED is maintained active for at least 200 milliseconds in the preferred embodiment so that the indicator stays solidly lit if valid data packets are being received at least every 200 milliseconds. The error correction LED is a yellow LED reflecting that transceiver 312 has attempted to perform an error correction on a received data packet. A more detailed description of the manner in which signals are displayed on LED display 344 is provided in a subsequent section herein.

Transceiver 312 is connected to network coupler 314. Network coupler 314 comprises a switch for selecting between differential and common mode 120/240 volt operation. Network coupler 314 is well known to those of ordinary skill in the art. Network coupler 314 is coupled to switch 316. Switch 316 is used to select between an external network connection provided at external coupling connector 318 or an internal network connection provided at IEC connector 320. Connector 320 is coupled through fuses 322. Connector 320 corresponds to a connector suitable for coupling PLCA 300 to outlet 214 or 224 illustrated in FIG. 2. PLCA 300 is thereby coupled to power line communication network 150. A 120 or 240 volt AC voltage is provided across this connector 320. Power for PLCA is provided by tapping the power source present on line 323 through filter 324 and power supply 326. Filter 324 and power supply 326 convert the alternating current present on the network 150 to a direct current suitable for driving the internal logic of PLCA 300. The direct current output by power supply 326 is fed to voltage regulators 330 through fuse 329. Voltage regulators 330 provide a direct current power source at a suitable voltage level for powering the internal logic of PLCA 300. In addition, the preferred embodiment provides a DC power jack 328 providing a means for the user to provide an external DC power source to regulators 330. Thus, the internal architecture of PLCA 300 is described. The logic contained within control logic 310 and the interaction of this control logic with other components of PLCA 300 will now be described.

As illustrated in FIG. 2, two PLCA devices 210 and 220 are coupled to a network under test for the purpose of analyzing data transmission thereon. For testing communication in one direction, one PLCA device is configured as a transmit analyzer and the other PLCA is configured as a receive analyzer. The control logic 310 in PLCA 300 contains logic for operating in either a transmit analyzer mode or a receive analyzer mode. Either transmitter or receive mode may be dynamically configured during the operation of PLCA 300. The transmitter logic portion of control logic 310 generates and transmits explicit data messages over network 150 to a receive analyzer. Each data message includes a two-byte sequenced value, with a total of twelve bytes per packet (minimum) including overhead, plus a preamble. The receive analyzer looks for these messages in sequence. If there is a gap in the sequence, the missing messages are counted as lost by receiver logic within control logic 310. The transmission of these data messages is synchronized and sequenced using control messages.

The present invention provides two basic modes of operation: a physical layer mode and a protocol layer or acknowledged service mode. In the physical layer mode, data packets are transmitted on the power line communication network without acknowledgment from a receiver and without attempting to re-send a packet received in error. In the acknowledged mode, data packet transmission requires acknowledgment from a receiver and transmission retries are attempted if a data packet is not received properly.

Using the pair of PLCA devices 210 and 220 illustrated in FIG. 2, a power line communication network 150 can be analyzed. Because each PLCA 210 or 220 comprises identical transmitter and receiver control logic, network 150 can be tested in both directions via PLCA 210 and PLCA 220. Each PLCA includes control logic for configuring the PLCA as a transmit analyzer or a receive analyzer. When one PLCA is configured as a transmitter, the transmit analyzer automatically sends a control message to the other PLCA that automatically configures the companion PLCA as a receive analyzer, and vice versa. Transmitter logic within each PLCA provides a means for polling a remote receive analyzer for lost packet information which is displayed on the local transmit analyzer LCD display 340.

Transmitter and receive analyzer logic within control logic 310 includes logic for supporting physical layer or acknowledged service operation. In acknowledged service, data packets received by a receive analyzer are acknowledged by means of a packet acknowledgment sent back to the unit configured as a transmitter. If the acknowledgment is not received by the transmitter, the transmitter will retransmit the data packet; this transmission is repeated up to 3 times in the preferred embodiment. In physical layer operation, no acknowledgments are sent and each data packet is sent only once. In general, the operation of the present invention as described below performs in a similar manner for both physical layer and acknowledged service modes of operation.

In the following section, control logic 310 is described in relation to commands entered as key activations on keypad 342, messages sent from one PLCA to a second PLCA, and display information output by control logic 310 to LCD display 340. Because portions of the transmit analyzer portion of control logic 310 are distinct from the receive analyzer portion of control logic 310, the transmit analyzer logic and the receive analyzer logic are presented separately in the following detailed description. In each case, control logic 310 responds to the activation of keys on keypad 342 and messages sent from a remote PLCA. Thus, control logic 310 is described below in relation to particular command key selections activated on keypad 342 and messages received from a remote PLCA. It will be apparent to one of ordinary skill in the art that other forms of command or message input may be used to set parameters and view information from PLCA 300. For example, a host input/output port may be provided on PLCA 300 for transferring command and status information to/from a host computer.

Figure 4:
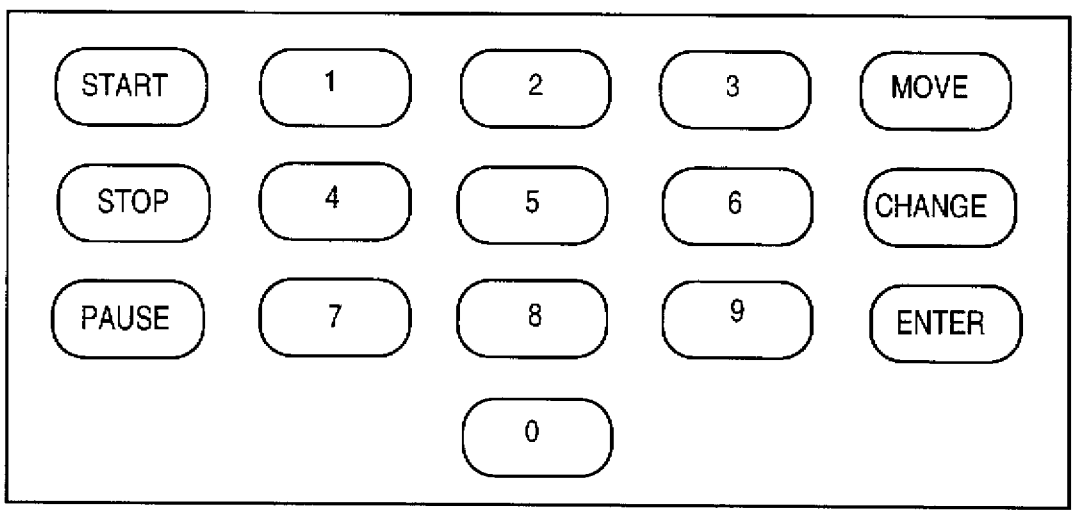
FIG. 4 illustrates the user keypad of the PLCA.

Referring now to FIG. 4, the keys provided on keypad 342 in the preferred embodiment of the present invention are illustrated. As shown, the keys of keypad 342 comprise a start key, a stop key, a pause key, a move key, a change key, an enter key, and a 0–9 numeric key set.

The power line communication analyzer 300 is set in a transmit analyzer mode or a receive analyzer mode using a particular key sequence on keypad 342 as described below. Once the transmit/receive analyzer mode has been set, the transmit analyzer logic or receive analyzer of control logic 310 responds to key activations on keypad 342 as described in the following sections. Because the response to key activations on keypad 342 may be different for a PLCA operating in a transmit analyzer mode and receive analyzer mode, control logic 310 is described in the following sections in relation to a previously set transmit analyzer mode or receive analyzer mode.

Figure 5:
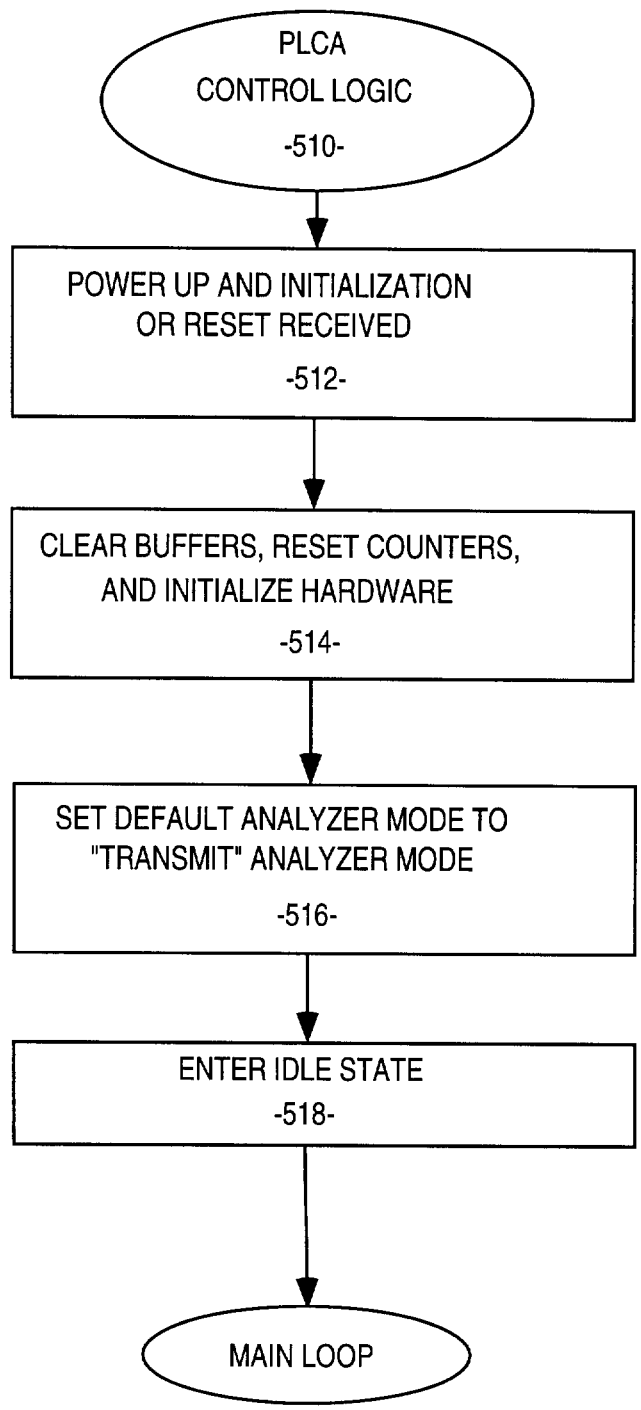

Referring to the flowcharts illustrated in FIGS. 5 through 26, the processing logic contained within control logic 310 of the preferred embodiment is illustrated. Referring now to FIG. 5, the power line communication analyzer control logic begins at bubble 510 on power-up or reset of the analyzer. The power up initialization or reset is received in processing block 512. Basic initialization of the system such as clearing buffers, resetting counters, and initializing hardware is performed in processing block 514. A default analyzer mode is set to receive analyzer mode in processing block 516. The default analyzer mode is set the first time the analyzer is ever powered up. After that first time, the current analyzer mode is retained in non-volatile storage and used for each subsequent power-up initialization.

Each PLCA can operate as a transmit analyzer or a receive analyzer. The transmit/receive mode is one of several modes of operation provided by the present invention. An operational mode is set to an initial default condition of IDLE in processing block 518. The bubble labeled MAIN LOOP begins a normal operation loop of the PLCA as performed by the processing logic illustrated starting in FIG. 6.

Figure 6:
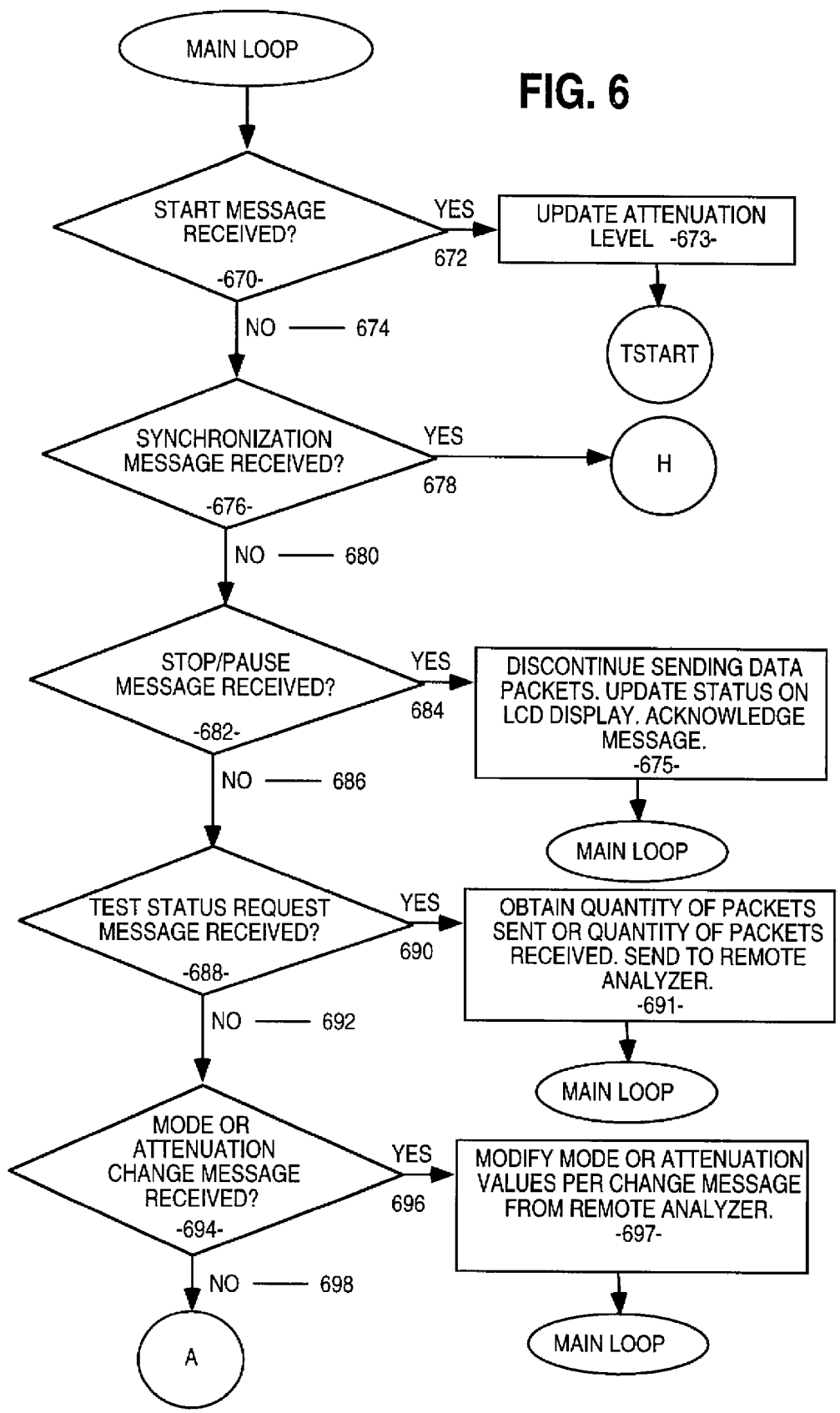

Referring to FIG. 6, the first part of the PLCA MAIN LOOP is illustrated. In this part of the main loop, the PLCA logic checks for any control messages that may have been received from a remote PLCA. These control messages comprise a start message, a synchronization message, a stop/pause message, a test status request message, and a mode or attenuation change message. It will be apparent to one of ordinary skill in the art that other types of control messages can be provided. Starting at decision block 670, the PLCA checks for a start message. A start message is generated by a remote receiver PLCA when a remote user activates a start key on the remote PLCA keypad. In this case, the attenuation level is sent by the remote PLCA in the start message. The local PLCA updates the local attenuation level as specified by the remote PLCA in processing block 673. The local PLCA then jumps to the processing logic starting at the bubble labeled TSTART illustrated in FIG. 15 where a transmitter start sequence is initiated. If a synchronization message is received, processing path 678 in FIG. 6 is taken to the bubble labeled H illustrated in FIG. 20. The synchronization message is used to prepare a receiver PLCA for the reception of test data packets from a transmitter PLCA.

Referring to decision block 682 in FIG. 6, processing path 684 is taken if a stop/pause message is received from a remote PLCA. This message is sent if a user activates a stop or pause key on a remote PLCA keyboard. In this case, a transmitter PLCA will discontinue sending test data packets and will update the local LCD display with the new pause or stop status. The local PLCA will also acknowledge the receipt of the stop/pause message to the remote PLCA (processing block 675). Control then returns to the top of the main loop illustrated in FIG. 6.

Referring to decision block 688 in FIG. 6, processing path 690 is taken if a test status request message is received from a remote PLCA. This message is sent when a remote PLCA requires information pertaining to the quantity of test data packets sent by a transmitter PLCA or the quantity of test data packets received by a receiver PLCA. This information is used to update the display of each PLCA with current test and error information. On receipt of this message, the quantity of test data packets sent or the quantity of test data packets received is sent to the remote (requesting) PLCA in processing block 675. Control then returns to the top of the main loop illustrated in FIG. 6.

Referring to decision block 694 in FIG. 6, processing path 696 is taken if a mode or attenuation change message is received from a remote PLCA. This message is sent when the transmit/receive mode or the attenuation level is changed in a remote PLCA. This kind of change causes the local PLCA to immediately respond to the remote PLCA change. In this manner, the two PLCAs always operate in a compatible condition. On receipt of this message, the mode or attenuation level in the local PLCA is changed to correspond to the mode or attenuation level of the remote PLCA in processing block 697. Control then returns to the top of the main loop illustrated in FIG. 6. If no control message has been received from a remote PLCA, control passes to the bubble labeled A illustrated in FIG. 7 where keypad key activations are processed.

Figure 7:
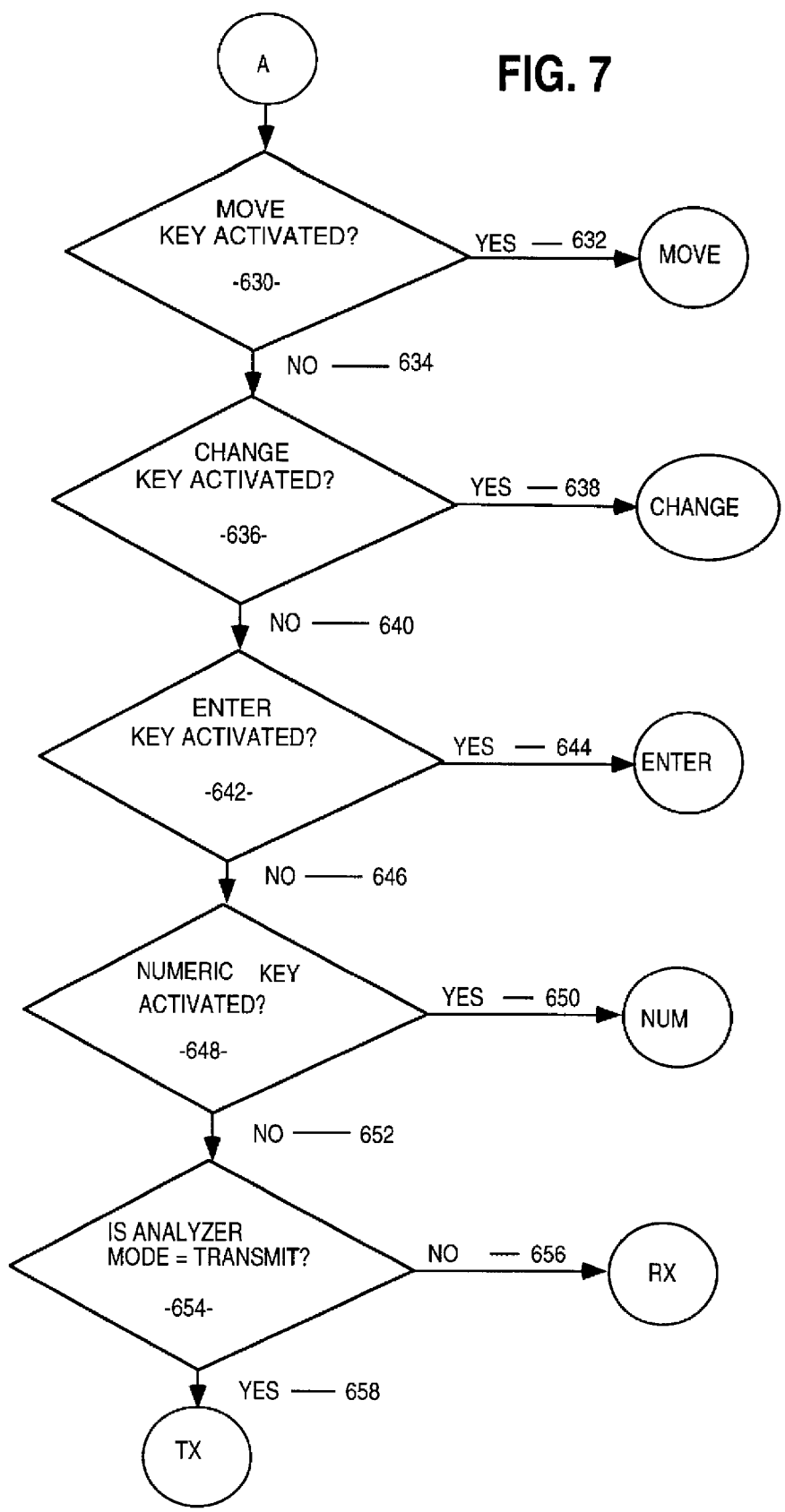
Figure 10:
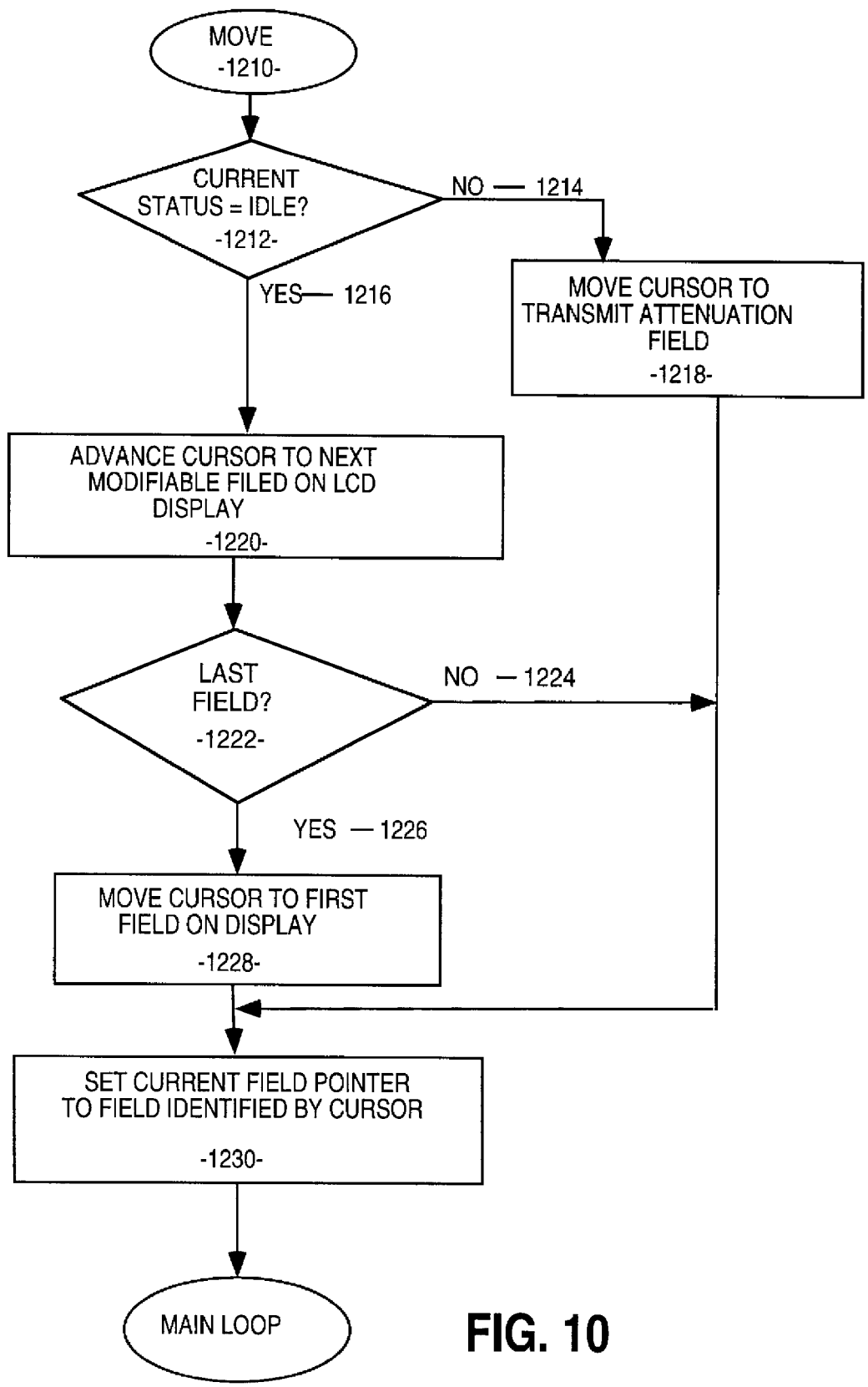
Figure 11:
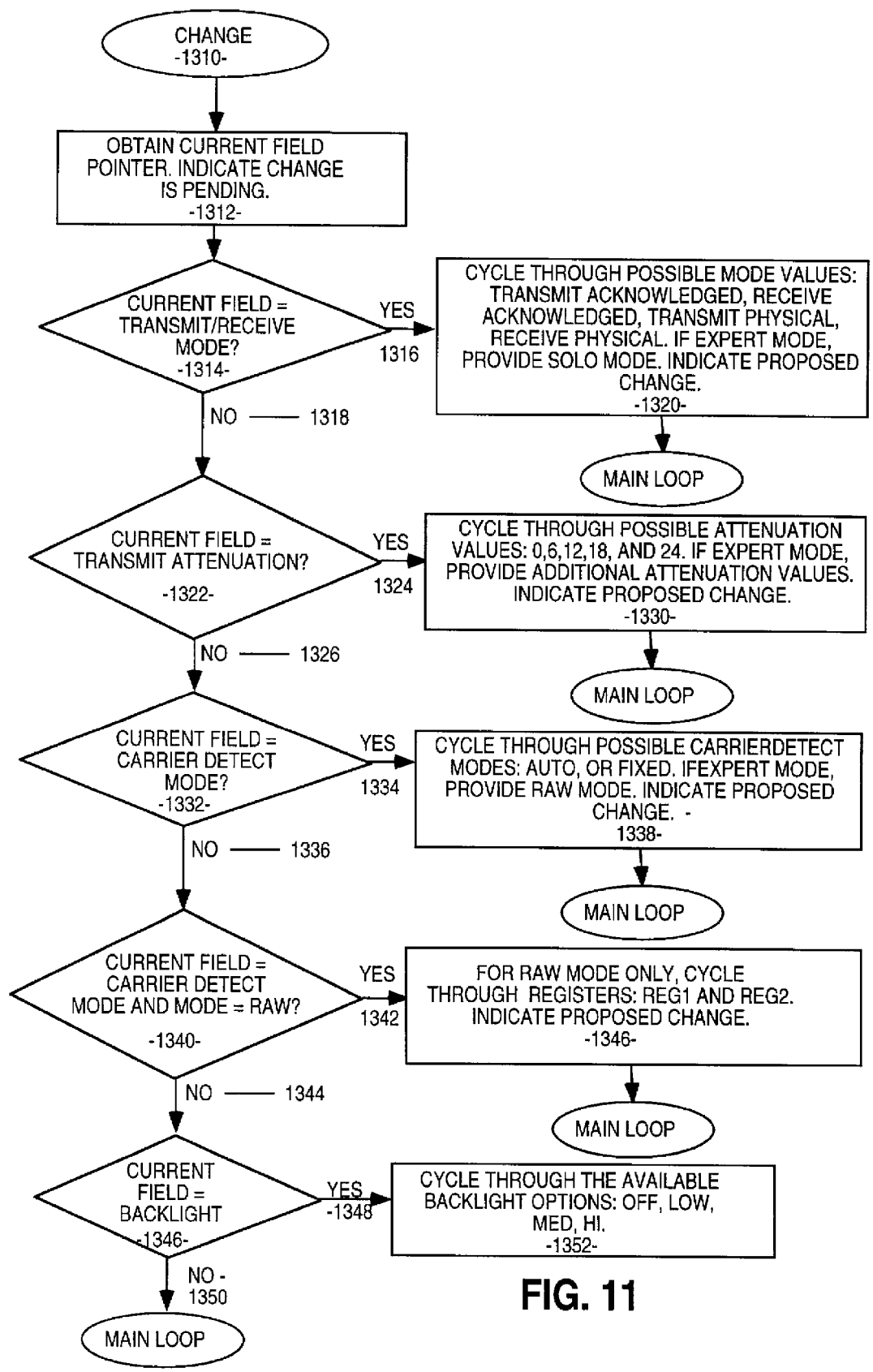
Figure 12:
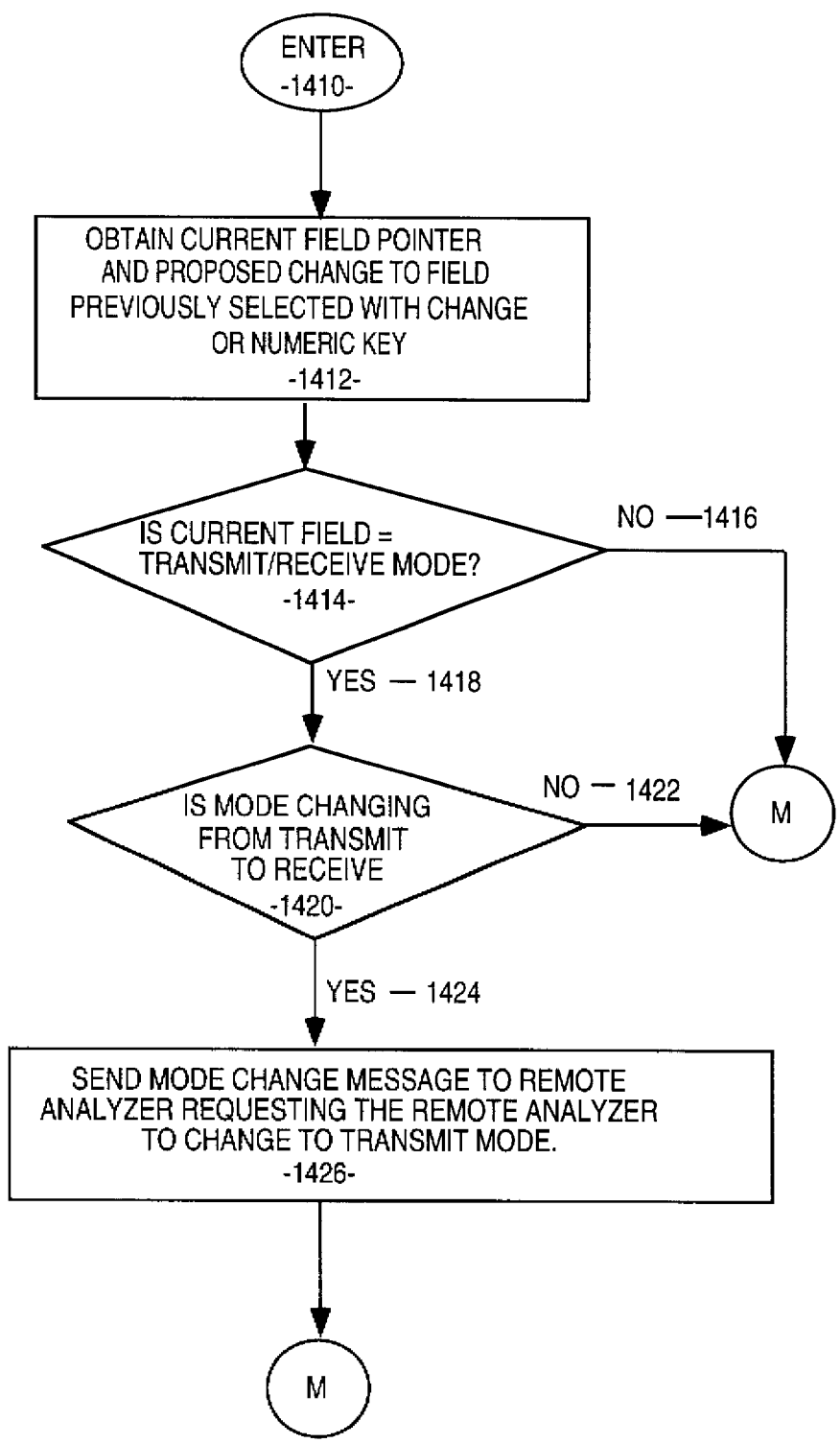
Figure 13:
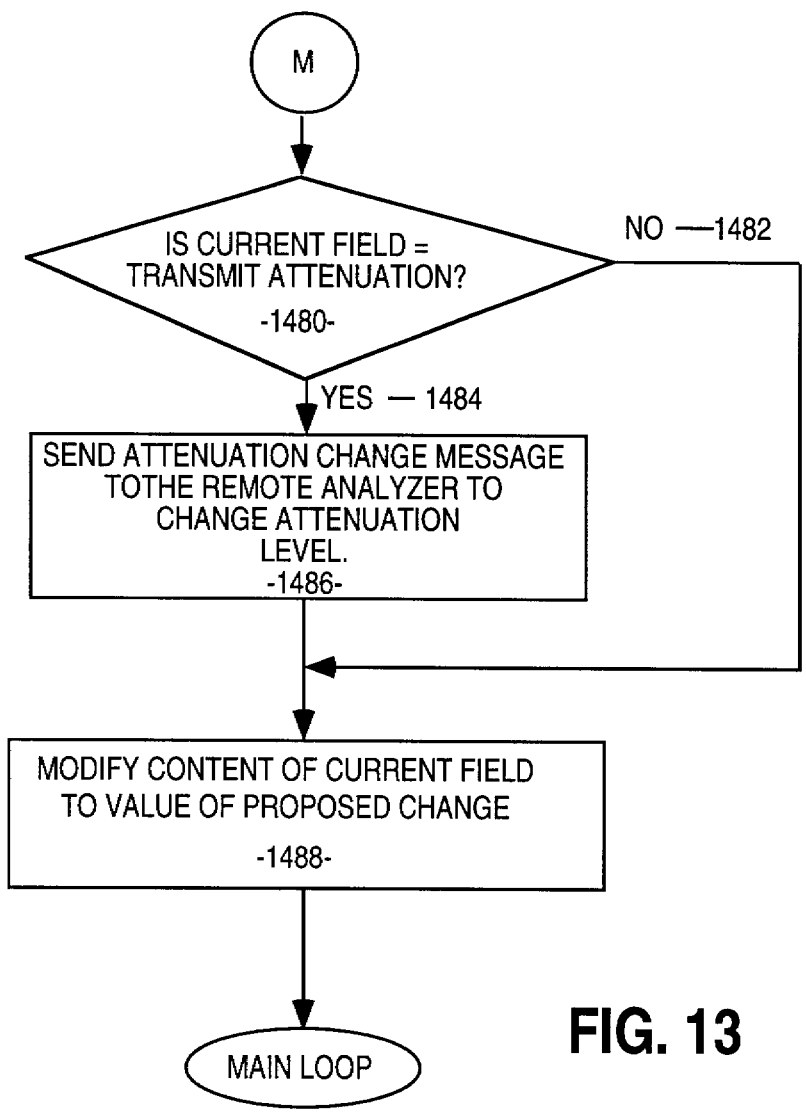
Figure 14:
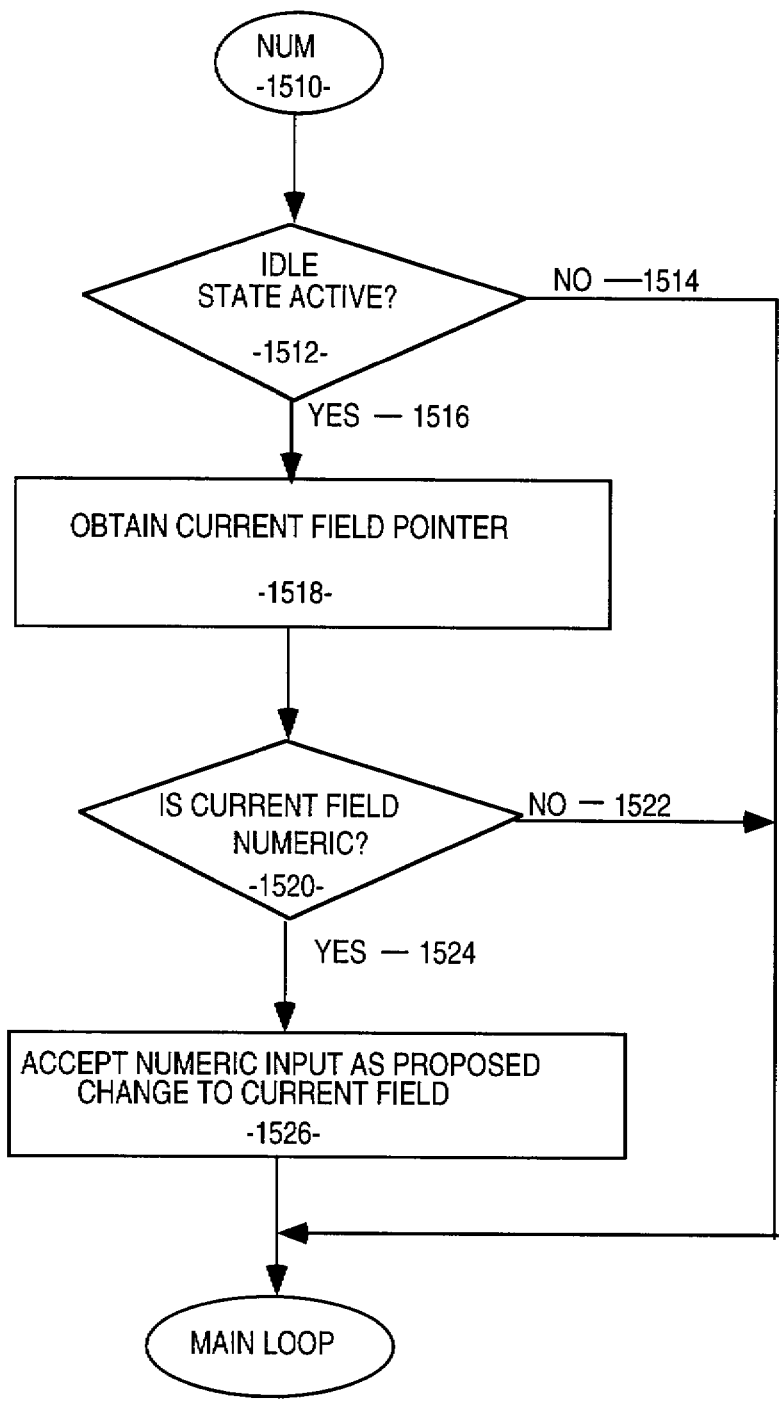

Referring now to FIG. 7, key activation processing logic is illustrated starting at the bubble labeled A. If the move key is activated on keypad 342, processing path 632 is taken to the bubble labeled MOVE as illustrated in FIG. 10. If the change key is activated, processing path 638 is taken to the bubble labeled CHANGE as illustrated in FIG. 11. If the enter key is activated processing path 644 is taken to the bubble labeled ENTER as illustrated in FIGS. 12 and 13. And finally, if a numeric key of the numeric key set provided on keypad 342 is activated, processing path 650 is taken to the bubble labeled NUM as illustrated in FIG. 14. Having tested for the activation of the move, change, enter, or numeric keys, the analyzer mode is tested to determine if the PLCA is configured as a transmitter or a receive analyzer (decision block 654). If the PLCA is configured as a transmitter (processing path 658), processing continues at the bubble labeled TX illustrated in FIG. 8 where the transmit analyzer specific functionality is provided. If, however, the analyzer is operating in a receive mode, processing path 656 is taken to bubble RX illustrated in FIG. 9 where the receive analyzer specific functionality is illustrated.

Figure 8:
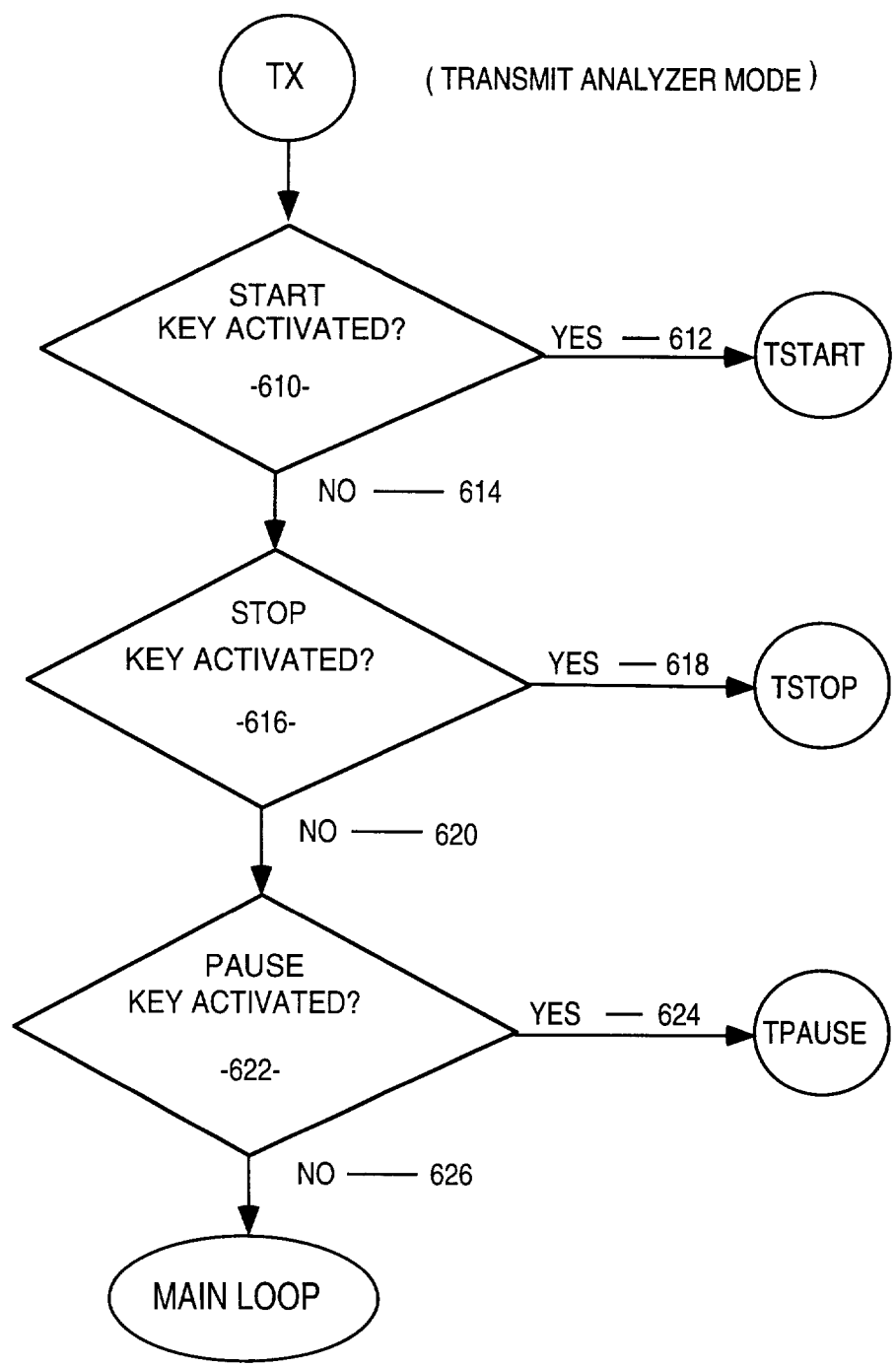
Figure 15:
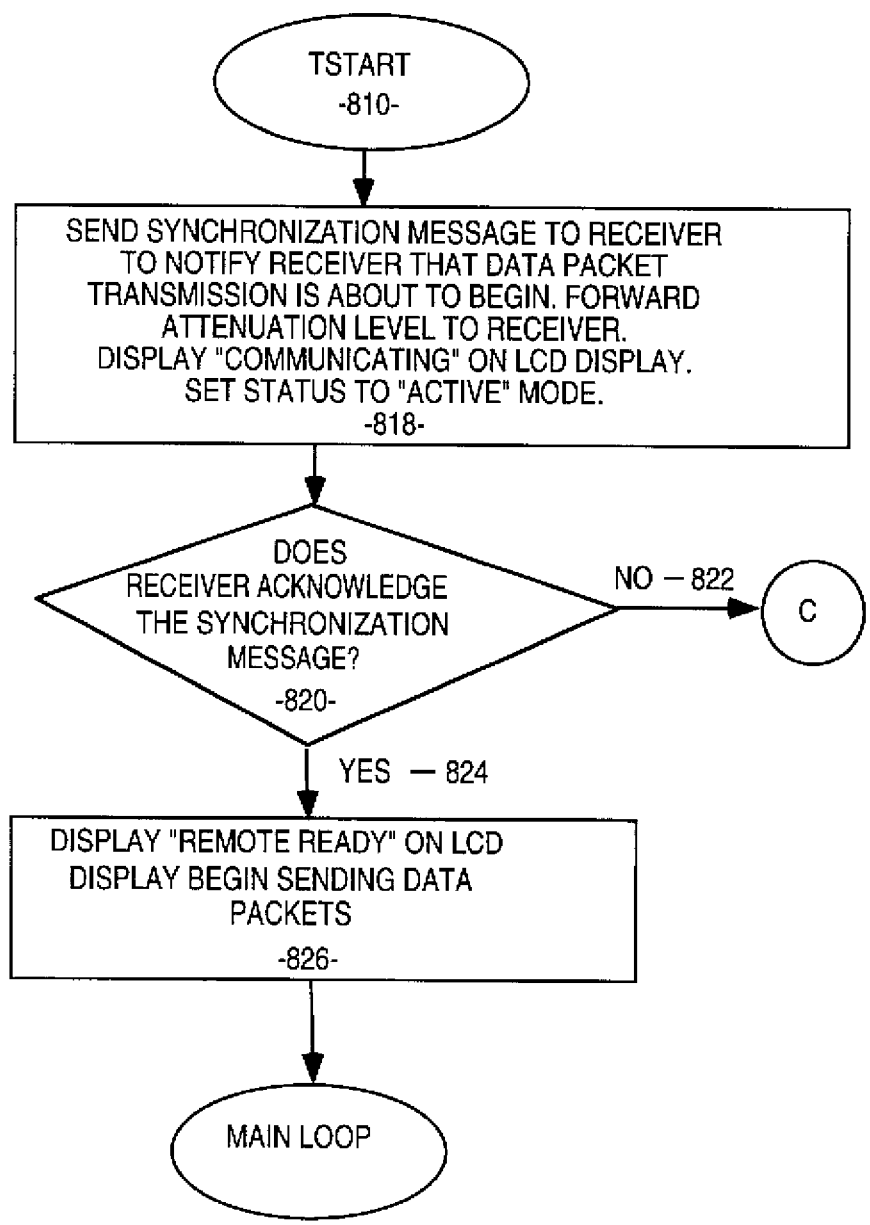
Figure 16:
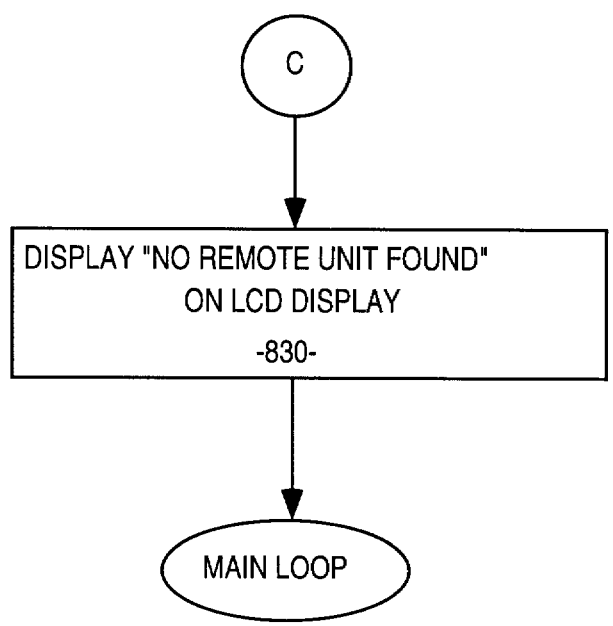
Figure 17:
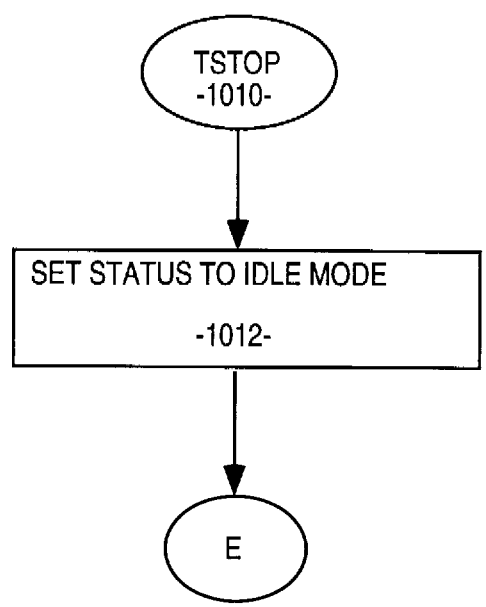
Figure 18:
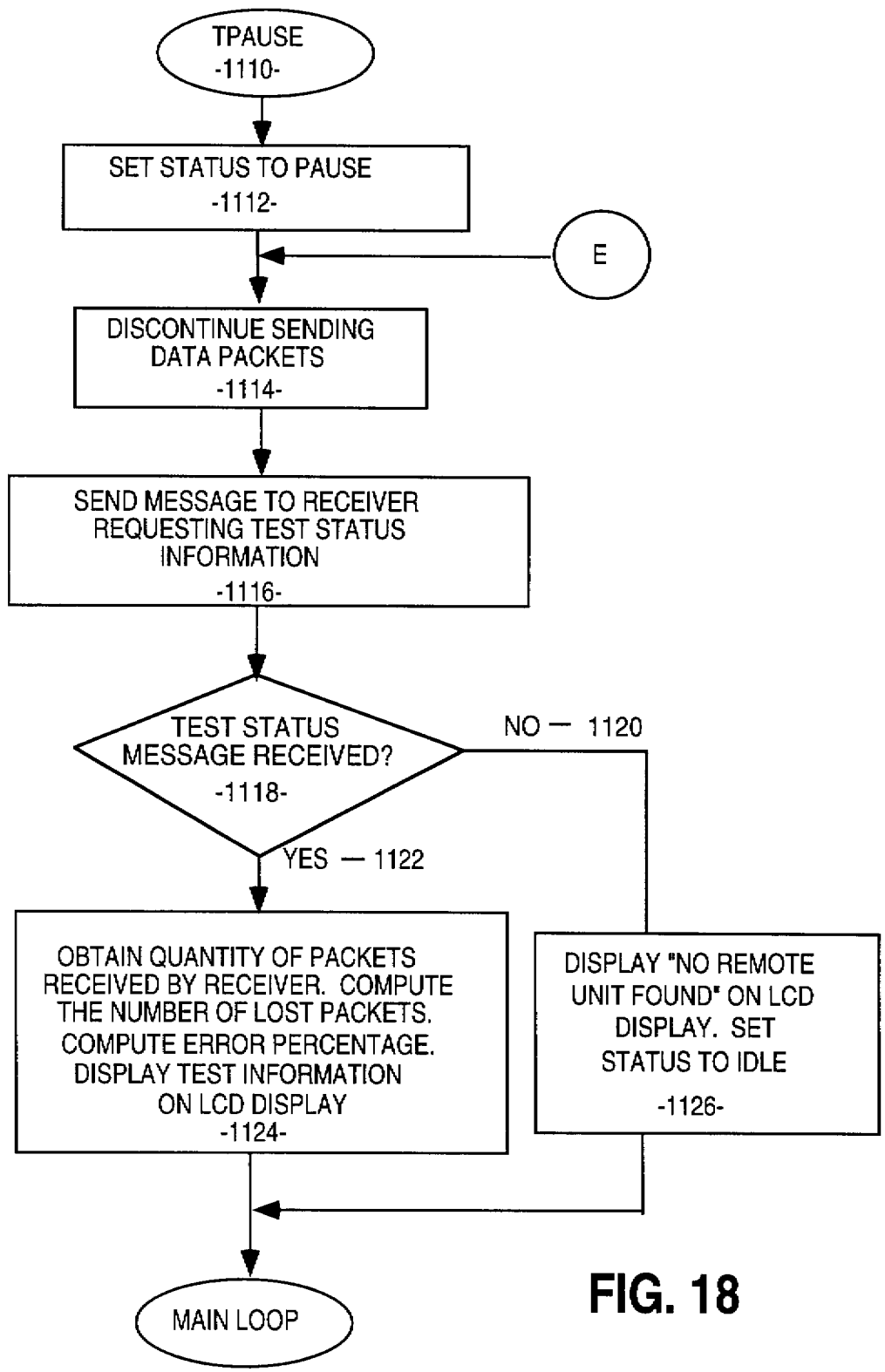

As illustrated in FIG. 8, the transmit analyzer processing logic receives key activations from keypad 342 and responds to the key activations accordingly. For a start key activation (processing path 612), processing continues at the bubble labeled TSTART as illustrated in FIGS. 15 and 16. If a stop key is activated, processing path 618 is taken to the bubble labeled TSTOP as illustrated in FIG. 17. If the pause key on keypad 342 is activated, processing path 624 is taken to the bubble labeled TPAUSE as illustrated in FIG. 18.

Figure 9:
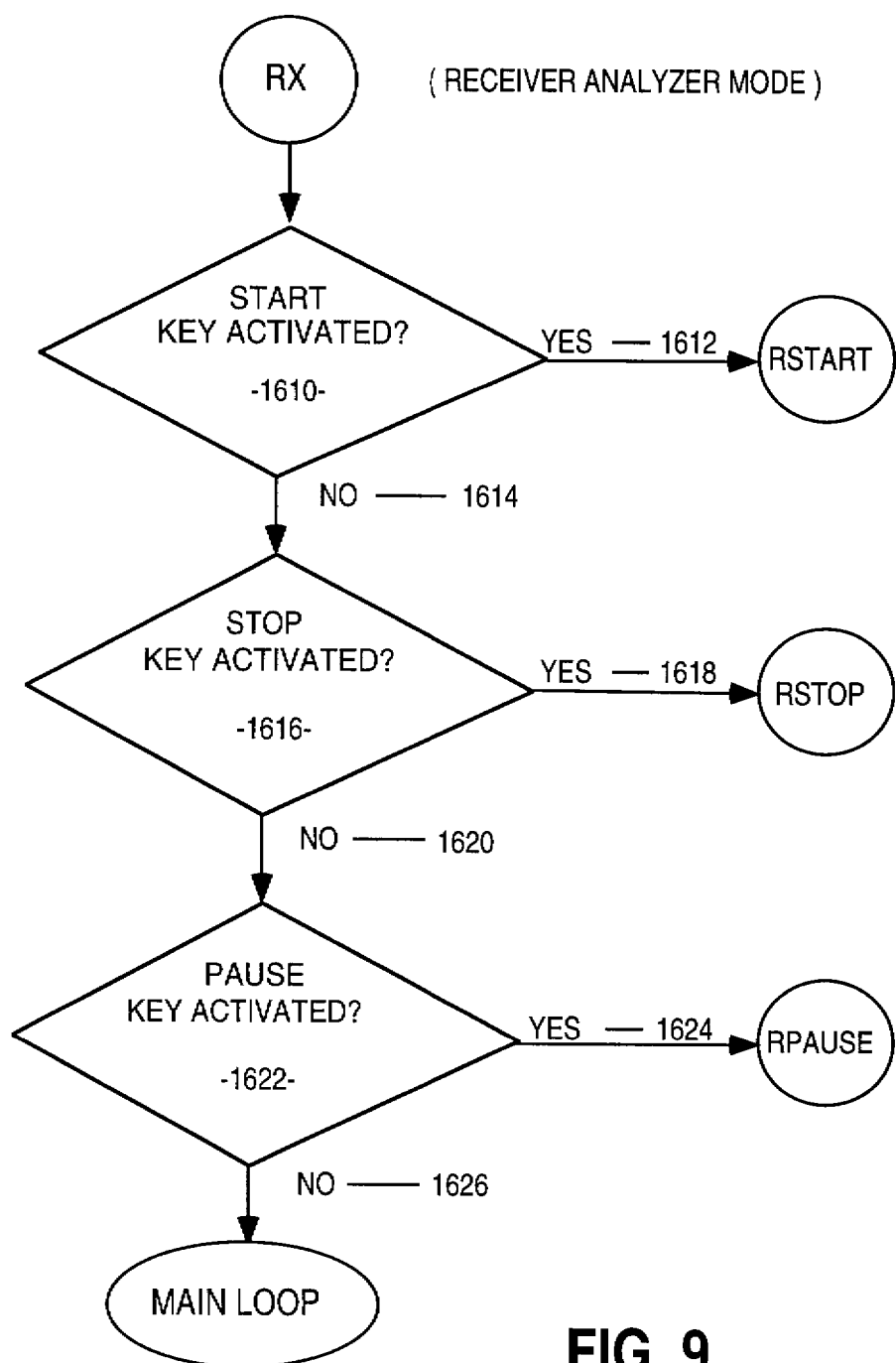
Figure 19:
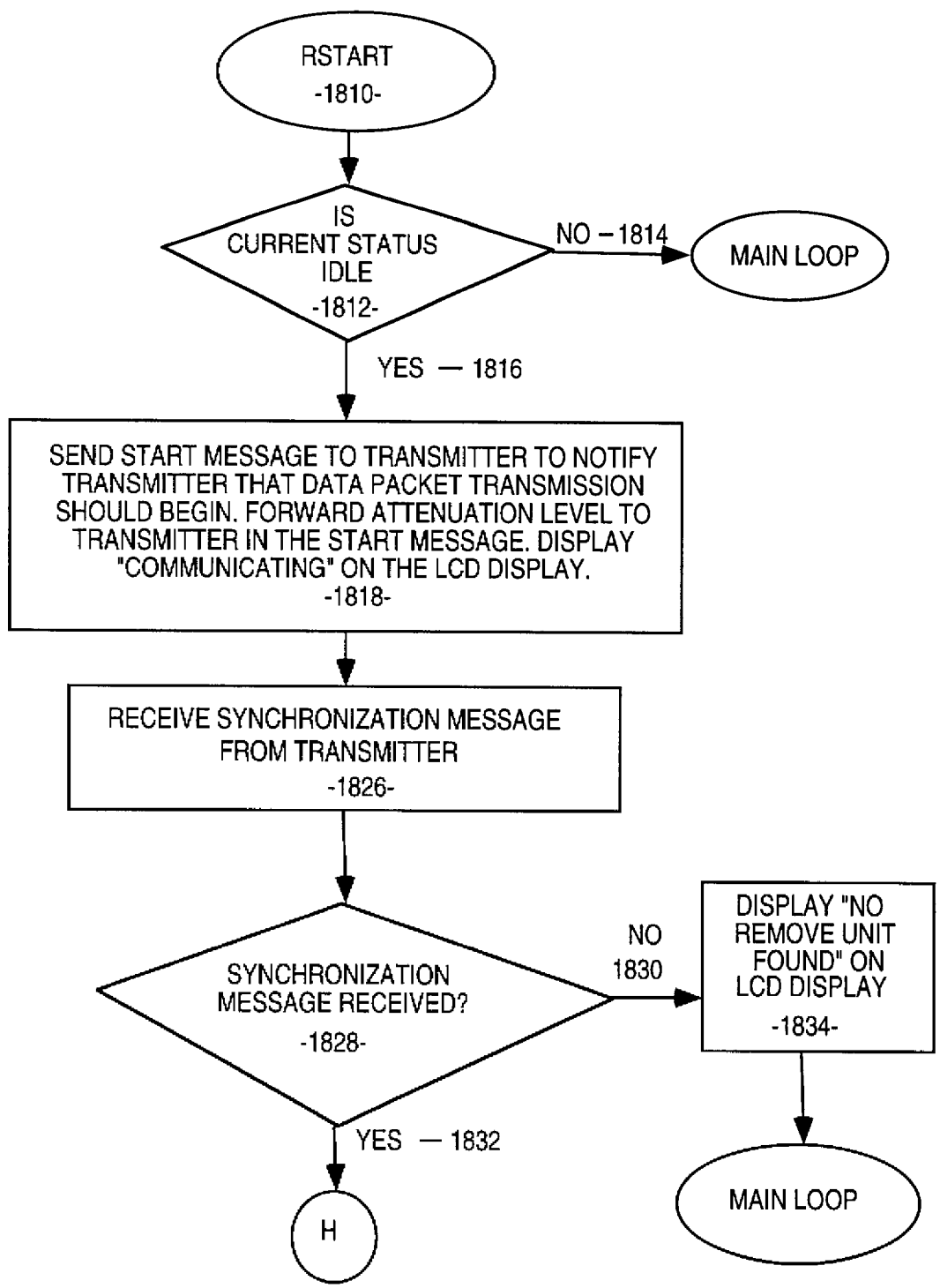
Figure 20:
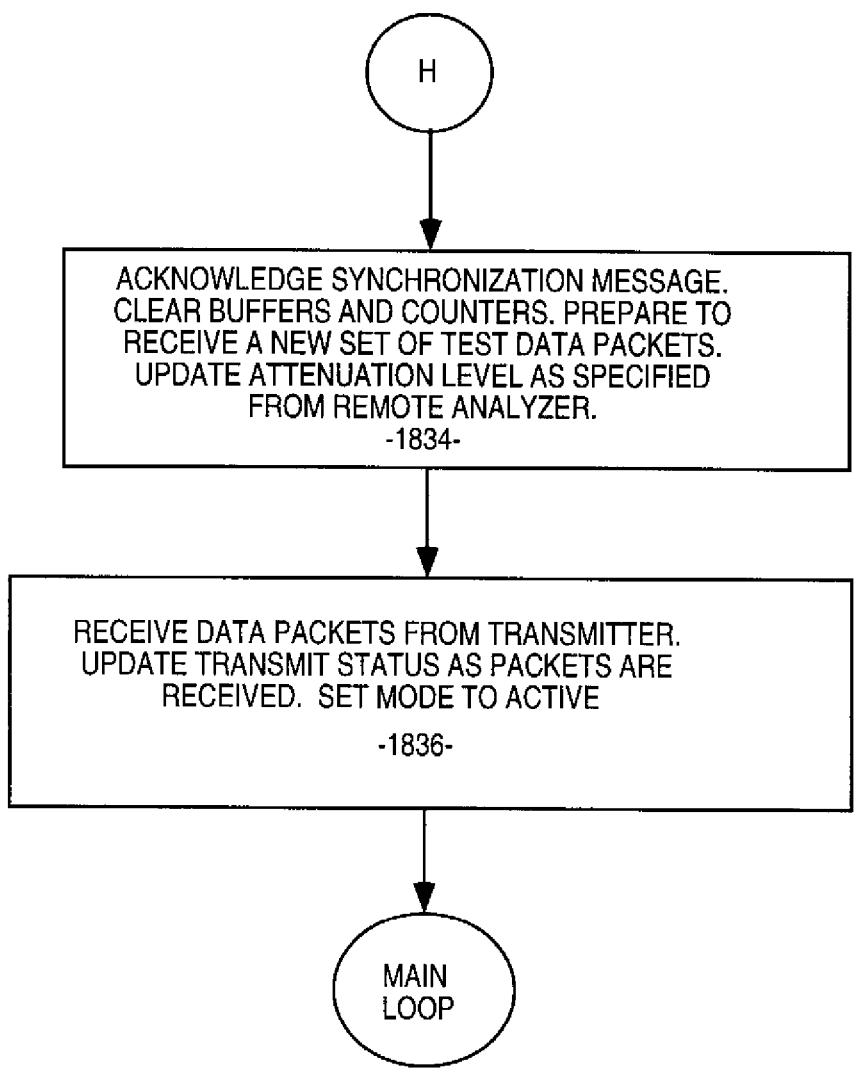
Figure 21:
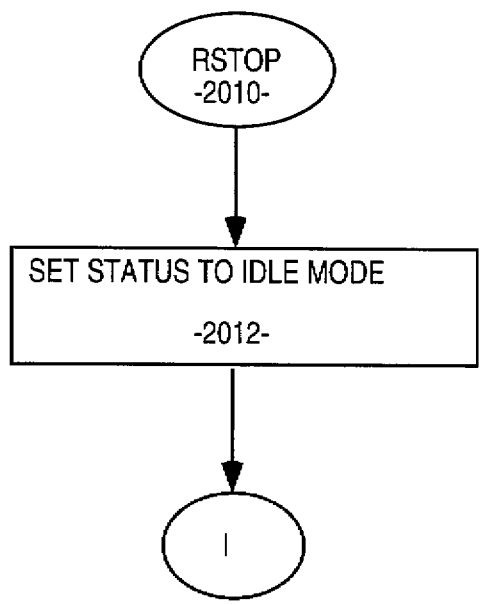
Figure 22:
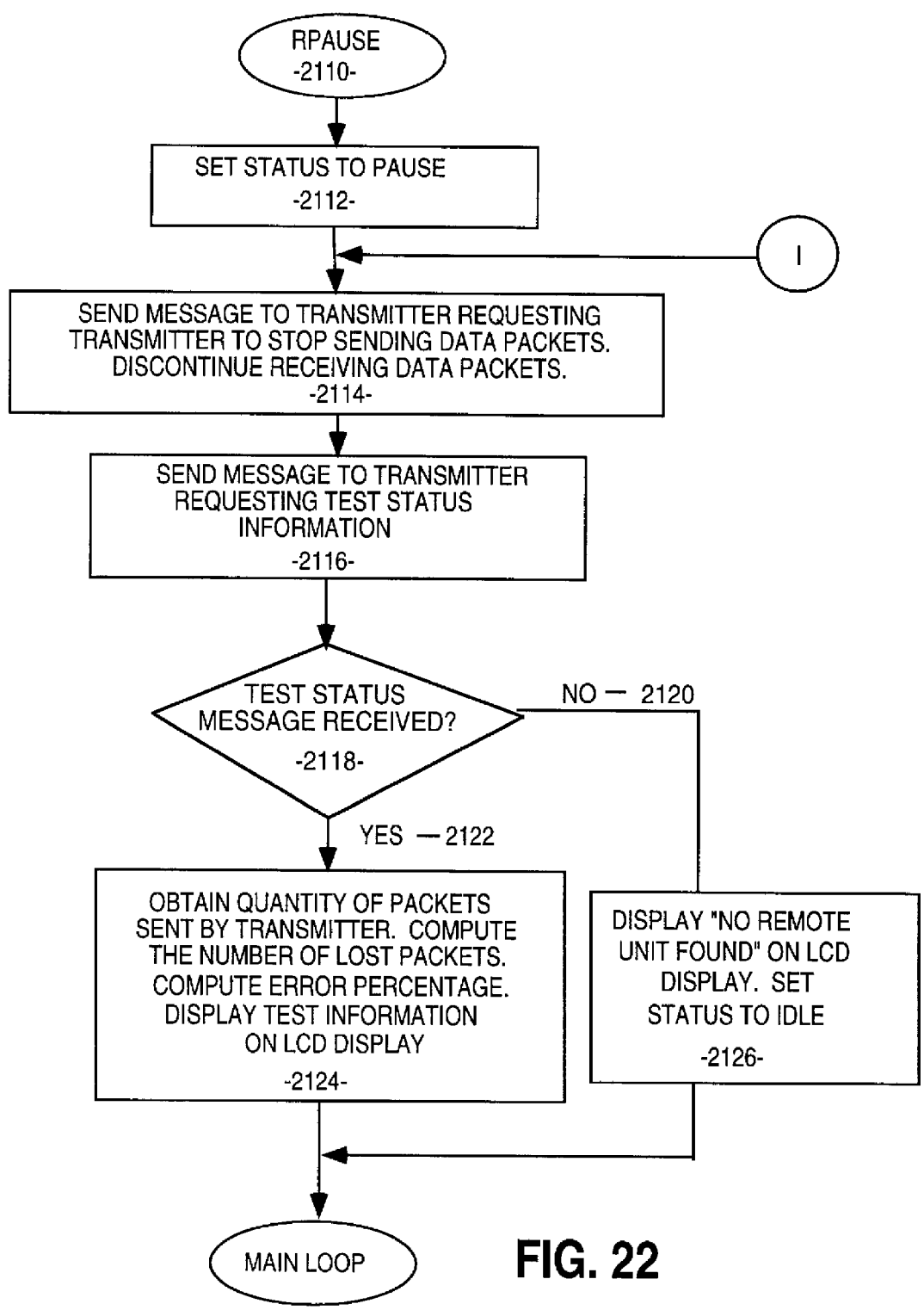

As illustrated in FIG. 9, the receive analyzer processing logic receives key activations from keypad 342 and responds to its key activations accordingly. For a receiver start key activation (processing path 1612), processing continues at the bubble labeled RSTART as illustrated in FIGS. 19 and 20. If a receiver stop key is activated, processing path 1618 is taken to the bubble labeled RSTOP as illustrated in FIG. 21. If the pause key on receiver keypad 342 is activated, processing path 1624 is taken to the bubble labeled RPAUSE as illustrated in FIG. 22.

Referring now to FIG. 10, the processing logic for a move key activation is illustrated starting at bubble 1210. The move key, the change key, and the enter key are all used to specify and modify various system parameters presented on LCD display 340. The move key is used to move a cursor from one modifiable field on LCD display 340 to the next modifiable field in sequential order. As the cursor moves through the last field on LCD display 340, the processing logic in FIG. 10 wraps the cursor back to the first field of the LCD display 340. Beginning at decision block 1212 illustrated in FIG. 10, the current status of the analyzer is tested. If the current status is IDLE, the cursor is allowed to advance to the next modifiable field on LCD display in processing block 1220. If the cursor transitions through the last field on LCD display 340, processing block 1228 is executed to move the cursor to the first field on LCD display 340. The current field pointer is set in processing block 1230. The current field pointer identifies the field to which the cursor has been moved. Processing for the move key activation loops back to the normal processing loop at the MAIN LOOP bubble illustrated in FIG. 6.

Referring again to decision block 1212 illustrated in FIG. 10, if the current status of the transmit analyzer is not IDLE, processing path 1214 is taken to processing block 1218 where the cursor is moved to the transmit attenuation field. Because the transmit attenuation field can be modified during active operation of the transmitter or receiver, the cursor is automatically positioned at the transmit attenuation field on activation of the move key while the PLCA is not in an IDLE mode. In this case, the current field pointer is set to the transmit attenuation field in processing block 1230 and processing continues at the MAIN LOOP bubble illustrated in FIG. 6.

Referring now to FIG. 11, the processing logic for a change key activation is illustrated starting at bubble 1310. The change key is used to cycle the current field through a set of values that the field can assume. In processing block 1312, the current field pointer is obtained and the status of the current field is modified to indicate that a change to the field is pending. If the current field is the transmit/receive mode field, processing path 1316 is taken to processing block 1320 where the set of values for the transmit/receive mode is displayed sequentially for each change key activation on LCD display 340. The set of values for the transmit/receive mode comprise a transmit acknowledged mode, receive acknowledged mode, transmit physical mode, receive physical mode, and expert (solo) mode. The expert (solo) mode is provided to enable testing with a single analyzer coupled to the power line network. The proposed change is selected in processing block 1320. Processing then continues through the MAIN LOOP bubble illustrated in FIG. 6 where processing for the next command message or the next key activation continues. If the current field is the transmit attenuation field, processing path 1324 is taken to processing block 1330 where the set of values for the transmit attenuation field are displayed sequentially on LCD display 340. The possible attenuation values selectable in the preferred embodiment comprise 0, 6, 12, 18, and 24 dB. If the expert mode is active, additional transmit attenuation values are provided (i.e., 99). The proposed transmit attenuation field change is indicated as selected by a user in processing block 1330. Processing then continues through the MAIN LOOP bubble illustrated in FIG. 6. If the current field is the carrier detect mode field, processing path 1334 is taken to processing block 1338 where the set of values which the carrier detect mode can assume are displayed sequentially on LCD device 340. The possible values in the preferred embodiment for carrier detect mode are auto or fixed. An auto carrier detect mode indicates that the analyzer is set for automatic adjustment of carrier detect threshold. A fixed carrier detect mode indicates a fixed carrier detect threshold level. Another mode is available in expert operation. This additional mode is the RAW mode. In this case, the carrier detect threshold and other configuration parameters are defined by two internal control registers labeled REG1 and REG2. The proposed change to the carrier detect mode is indicated in processing block 1338. If the current field is the carrier detect select field and the RAW mode is active, processing path 1342 is taken to processing block 1346 where one of the two configuration registers REG1 or REG2 can be selected. The selected register is indicated in processing block 1346. If the current field is the backlight select field, processing path 1348 is taken to processing block 1352 where the logic cycles through the available backlight options: OFF, LOW, MED, and HI. In each case, processing continues through the MAIN LOOP bubble illustrated in FIG. 6.

Referring now to FIG. 12, the processing logic for activation of the enter key is illustrated starting at bubble 1410. The enter key is used to apply a previously proposed change to a selected field. After a proposed field change is specified using the move and change or numeric keys, the enter key is used to apply the change to the selected field. In processing block 1412, the current field pointer is obtained and a previously proposed change to the field is also obtained. If the current field is the transmit/receive mode field, processing path 1418 is taken to decision block 1420. If the transmit/receive mode is changing from a transmit mode to a receive mode, processing path 1424 is taken to processing block 1426 where a control message is sent to the remote analyzer requesting the remote analyzer to change to a transmit mode (processing block 1426). If the current field is not the transmit/receive mode field (processing path 1416) or the mode is not changing to receive mode (processing path 1422), processing continues at the bubble labeled M illustrated in FIG. 13.

Referring to FIG. 13, processing path 1484 is taken if the current field is the transmit attenuation field. In this case, a control message is sent to the remote analyzer requesting the remote analyzer to change to the attenuation level (processing block 1486). In all other cases, the response to an enter key activation is to modify the content of the current field to the value of the proposed change (processing block 1488). Processing then continues at the MAIN LOOP bubble illustrated in FIG. 6.

Referring now to FIG. 14, the processing logic for a numeric key entry on keypad 342 is illustrated. Because numeric key entry is only allowed in IDLE mode, processing path 1514 is taken to the MAIN LOOP bubble illustrated in FIG. 5, if IDLE mode is not active. If, however, IDLE mode is active, processing path 1516 is taken to processing block 1518 where the current field pointer is obtained. If the current field is a numeric field, processing path 1524 is taken to processing block 1526 where the numeric input is accepted and the proposed change to the numeric field is applied in processing block 1526. If, however, the current field is not a numeric field, processing path 1522 is taken and processing for the numeric key entry terminates through the MAIN LOOP bubble illustrated in FIG. 6.

Referring now to FIG. 15, processing for an activation of the start key for an analyzer configured as a transmitter is illustrated in FIG. 15 starting at bubble 810. The start key is used to initiate the sending of data packets from a transmit analyzer.

In processing block 818, a synchronization message is sent by the transmit analyzer to a receive analyzer coupled somewhere out on powerline communication network 150. The synchronization message is intended to notify a receive analyzer that data packet transmission is about to begin in a new test sequence. The transmitter also forwards the current transmitter attenuation level to the receiver PLCA. The transmit analyzer also displays a message "communicating" on LCD display 340. An active mode is also entered in processing block 818. If the receive analyzer acknowledges receipt of the synchronization message, processing path 824 is taken to the processing block 826 where a message "remote ready" is displayed on LCD display 340. In this case, the transmit analyzer begins sending test data packets to the receive analyzer present on network 150. The data packets are continuously sent until a pause key or a stop key activation is received or the transmitter completes the test by sending the selected number of test packets. Processing continues at the MAIN LOOP bubble illustrated in FIG. 6 at the top of the normal processing loop. Referring again to decision block 820, if the receive analyzer does not acknowledge receipt of the synchronization message, processing path 822 is taken to the bubble labeled C illustrated in FIG. 16.

Referring now to FIG. 16 starting at bubble C, a message "no remote unit found" is displayed on LCD display 340 in processing block 830. Processing then continues at the top of the normal processing loop at the MAIN LOOP bubble illustrated in FIG. 6.

Referring now to FIG. 17, the processing logic for handling a stop key activation for a PLCA configured as a transmitter is illustrated starting bubble 1010. For a stop key activation, the analyzer status is set to IDLE mode in processing block 1012 and processing continues at the bubble labeled E illustrated in FIG. 18. Portions of the processing performed for a stop key activation are similar to the processing steps performed for a pause key activation.

Referring now to FIG. 18, the processing logic performed for a pause key activation for a PLCA configured as a transmitter is illustrated starting at bubble 1110. Initially, a status indication is set to PAUSE in processing block 1112. At any time during a transmission test, activation of the PAUSE key will stop the transmission and display test status information on LCD display 340. The test status information indicates the number of data packets transmitted by the transmit analyzer, the number of lost data packets, and a percentage error value computed as a ratio of the number of lost data packets over the total number of packets sent by the transmit analyzer. The transmitter informs the receiver of the quantity of data packets transmitted. The receiver informs the transmitter of the quantity of data packets received successfully. The test status information is computed as follows. The quantity of lost data packets equals:

$$\text{quantity of packets sent by the transmitter} - \text{quantity of packets received by the receiver}$$

The receive analyzer also computes the error percentage or error rate as a fraction of the number of packets lost times 100 over the number of packets sent by the transmitter. Error rate equals:

$$\frac{\text{Packets Lost} \times 100}{\text{Packets Sent by the Transmitter}}$$

The test status information indicates the quality of the data transmission between a transmitter and receive analyzer. In response to the pause key activation, data packet transmission is discontinued in processing block 1114. The transmit analyzer sends a message to the receive analyzer requesting the test status information in processing block 1116. If the test status information is received from the receive analyzer, processing path 1122 is taken to processing block 1124 where the quantity of packets received by the receiver is obtained. Because the transmit analyzer knows how many data packets were transmitted, the number of lost data packets can be computed. Further, the error percentage is computed as a ratio of the number of lost packets to the number of transmitted packets. The computed test status information is displayed on LCD display 340 in processing block 1124. Referring again to decision block 1118, processing path 1120 is taken if test status information is not received from the receive analyzer. In a manner described in a subsequent section, a retry operation is performed for a control sequence which is not completed successfully the first time. After a pre-set number of retries, processing path 1120 or 1122 is taken depending on whether the control sequence is completed successfully. If not completed successfully, a message "no remote unit found" is displayed on LCD display device 340. Further, the transmit analyzer status is set to IDLE in processing block 1126. Processing then continues at the MAIN LOOP bubble illustrated in FIG. 6.

FIGS. 19–22 illustrate the logic for processing keypad activations for an analyzer configured as a receiver is illustrated. Referring now to FIG. 19, the processing logic for the activation of the start key for an analyzer configured as a receiver is illustrated starting at bubble 1810. If the current status of the receive analyzer is IDLE, processing path 1816 is taken to processing block 1818 where the receive analyzer sends a start message to the transmit analyzer. The start message is intended to notify the transmit analyzer that data packet transmission should begin. The receiver also forwards the current attenuation level to the transmit analyzer. The attenuation level can be encoded into the start message. A message "communicating" is displayed on LCD display 340. The status of the receive analyzer is set to an active state in processing block 1818. In processing block 1826, the receiver sets up to receive a synchronization message from the transmit analyzer. The synchronization message is sent is response to the start message. If the synchronization message is received by the receive analyzer, processing path 1832 is taken to the bubble labeled H illustrated in FIG. 20. Again, a retry operation, described below, is performed if a synchronization message is not received.

Referring to the processing logic illustrated in FIG. 20, the receipt of the synchronization message from the transmit analyzer is acknowledged by the receive analyzer in processing block 1834. In anticipation of the new test sequence, applicable test buffers and counters are cleared in processing block 1834. The attenuation level is also updated as received in the synchronization message from the remote analyzer. A "remote ready" message is displayed on the LCD display 340 of the receive analyzer in processing block 1834. At processing block 1836, the receive analyzer sets up to receive data packets from the transmit analyzer. As data packets are received, transmit status maintained by the receiver is updated and displayed on LCD display 340. The receive analyzer mode is set to active in processing block 1836. Processing continues at the MAIN LOOP bubble illustrated in FIG. 6.

Referring again to FIG. 19 at decision block 1828, if the receive analyzer does not receive the synchronization message sent by the transmit analyzer, processing path 1830 is taken to processing block 1834 where a "no remote unit found" message is displayed on LCD display 340. Processing then continues at the top of the main processing loop at the MAIN LOOP bubble illustrated in FIG. 6.

Referring now to FIG. 21, the processing logic for activation of the stop key for an analyzer configured as a receiver is illustrated starting at the bubble 2010. For a stop key activation, the receive analyzer status is set to IDLE mode in processing block 2012. Processing then continues at the bubble labeled I illustrated in FIG. 22. Some processing for the stop key is common to the processing performed for the pause key as illustrated in FIG. 22.

Referring now to FIG. 22, processing for the activation of a pause key for an analyzer configured as a receiver is illustrated starting at the bubble 2110. Initially, the receive analyzer status is set to pause in processing block 2112. Because the receive analyzer has been paused, a control message is sent to the transmit analyzer requesting the transmitter to stop sending data packets. The receive analyzer also discontinues receiving data packets in processing block 2114. The receiver sends a control message to the transmit analyzer requesting test status information in processing block 2116. If the test status information is received from the transmitter, processing path 2122 is taken to processing block 2124. The retry operation, described below is performed if a control message is not initially received. If the control message is received, the quantity of packets sent by the transmitter is obtained from the test status information. Because the receive analyzer is aware of the number of packets received by the receiver, the receive analyzer can compute the number of lost data packets. Lost data packets equals:

$$\text{quantity of packets sent by the transmitter} - \text{quantity of packets received by the receiver}$$

The receive analyzer also computes the error percentage or error rate as a fraction of the number of packets lost times 100 over the number of packets received plus the number packets lost. Error rate equals:

$$\frac{\text{Packets Lost} \times 100}{\text{Packets Sent}}$$

This information is displayed on LCD 340 in processing block 2124. If, however, no status message is received from the transmit analyzer, processing path 2120 is taken to processing block 2126 where a "no remote unit found" message is displayed on LCD display 340. In this case, the receiver status is set to IDLE (processing block 2126). Processing for the pause key activation then continues through the bubble labeled MAIN LOOP illustrated in FIG. 6.

As described above, the transmitter and receiver portions of the PLCA of the preferred embodiment provide a means for selectively configuring the attenuation level of data packets sent across the power line communication network 150. One reason for attenuating a data transmission is to determine the margin between the receive signal strength of the data being transmitted and the noise level present on the network. In the preferred embodiment, attenuation is performed in hardware by shifting the digital transmit data sent to a digital to analog (D/A) converter within transceiver 312 by 0 to 4 bits. In addition, a DC bias is added to maintain the D/A converter's output DC level at 2.5 volts. Each one bit shift of transmit data corresponds to six dB of attenuation. To completely evaluate the reliability of the network communication between two points on the power line, measurements should be taken with the transmit signal attenuated by varying amounts to determine the margin of operation. In the preferred embodiment, transmission attenuation is selectable by the user to be 0, 6, 12, 18, or 24 dB. Attenuation is performed by arithmetically right-shifting the digital transmit data in the transceiver 312 by 0, 1, 2, 3, or 4 bits, respectively. The result of the shift is then added to an appropriate constant value to maintain signal symmetry about half-scale. The resulting digital data stream is then sent to a digital-to-analog converter and transmit amplifier within transceiver 312 for transmission on the power line.

Only test data packets are attenuated. All command, control, initialization, and synchronization packets transmitted over network 150 are sent with zero attenuation to maximize the probability that the command and control messages will be received error free by the receiving analyzer. Both the transmit analyzer and the receive analyzer always display the current attenuation level of the transmitter under test on their respective LCD displays 340. In this manner, the attenuation level for transmit data is always available to a user. Whenever the start button is activated on a receiver, the attenuation value on the receiver's display is forwarded to the transmitter. The transmitter updates its own display with that value and transmits the test data with the newly selected amount of attenuation. Whenever the start button is pushed on a transmitter, the attenuation value on the transmitter's display is forwarded to the receiver. The receiver updates its own attenuation value with the new value received from the transmitter. The user can change the transmit attenuation value from either a transmit analyzer or a receive analyzer at any time during a test using the change and enter keys. When the enter key is pressed, the new attenuation value is sent from the local receiver or transmitter to the remote transmitter or receiver and the test resumes with the new attenuation value. In this manner, a user can selectively increase or decrease attenuation levels and examine the resulting effect to the packet transmission error rate displayed on LCD 340. For example, the attenuation level can be sequentially increased until an unacceptably high level of error is indicated by the error rate indication on LCD display 340. By increasing the attenuation through several levels, the operational margin existing on the power line communication network can be determined.

The Retry Operation

Many reliable communications protocols (including that of the present invention) that include guaranteed delivery of application messages (that is, not only is the message delivered, but the sender is informed if it is not) involve two-way communication where a message is delivered and an acknowledgment is expected within some predetermined length of time. If no acknowledgment is received, the message is retried, up to a predetermined number of times.

The sequence of steps (sending a message, and perhaps retries, and receiving an acknowledgment) is known as a transaction. In the present invention, retries are limited to 15. If more than 15 retries are required, multiple transactions are required and the application must maintain its own transaction number to ensure proper handling of duplicate packets. Transactions may also be unacknowledged, in which case, all retries are always sent.

This transaction-based strategy is quite adequate when error rates are reasonable, for example, less than 10%. In the environments where the PLCA is used, error rates are typically unknown and could easily exceed 10%. One method for overcoming a higher error rate is to increase the number of retries. This works up to a point. For example, assume a 90% error rate and up to two transactions with 15 retries each. A message will be delivered with a successful acknowledgment with the following probability:

$$(1-((1-(0.12))32))*100=27.6\%$$

This percentage is too low for usable operation. One modification would be to make the retry count even higher. The problem with this is that generating a huge number of retries is time consuming. It would take too long for the unit to give up in cases where the error rate is 100% (eg, remote unit disconnected).

Thus, a totally different communications strategy is required. The strategy used for control messages by the PLCA of the present invention is to require receipt of another application message from the remote unit rather than relying on just an acknowledgment. The initial transaction is sent acknowledged with up to 15 retries. The acknowledgment allows the retries to stop quickly when error rates are low. If no acknowledgment is received, an unacknowledged transaction is initiated with a smaller retry interval. Upon receipt of the application message by the remote unit, the remote unit turns around and sends a corresponding application message back to the initiator. The remote unit uses the same strategy of sending acknowledged messages followed by, if necessary, unacknowledged messages.

In this way, given the same 90% error rate and 2 transactions with 15 retries each, the probability of delivery with a successful acknowledgment (in this case the acknowledgment takes the form of an application message) is as follows:

$$((1-((1-0.1)32))2)*100=93.3\%$$

This gives a much better chance of success (93.3% vs. 27.6%). To achieve this probability of success with increased retries alone would require 270 retries.

All control messages are initially sent using the acknowledged protocol service with 15 retries and a 64 millisecond retry interval. If the initial control transaction is not successful, N additional transactions are initiated using the unacknowledged protocol service with 15 repeats and a 32 millisecond repeat interval. For remote key depressions and state change messages, N is 1. For statistics/response messages, N is 3. Because messages can require multiple transactions to get through, a transaction number is included in the messages so that the application can discard duplicates. An initial acknowledged message and its subsequent unacknowledged repeat messages all have the same application transaction number.

Address Resolution

Each PLCA unit is initially configured identically. In a network situation, however, the issue arises of how to assign addresses so that PLCA's can successfully communicate in a power line communication network environment. One possible solution is to require a dip switch, hardware switch, or other user intervention to select the addresses of particular PLCA's. This is inconvenient for the user and error prone.

Another option would be to use a known "cloned" domain addressing facility. This facility allows nodes (i.e., PLCA units) to clone their domain addressing information. This allows multiple nodes to have the same address; however, they are limited to a subset of addressing modes and limited to unacknowledged service. Such nodes are also vulnerable in duplicate generating topologies to receiving messages from themselves. Because use of the acknowledged service mode of operation is desirable and because the power line is a duplicate generating topology, using the cloning facility alone is not acceptable. Therefore, the following solution is used in the preferred embodiment which combines the cloning facility and normal unique addressing techniques.

Upon first power-up, every PLCA unit has the same addressing information. Unique addresses are assigned as follows:

Each unit is a member of two domains, a primary domain and a secondary domain. These domains have one byte domain identifiers (IDs) of 0×EC and 0×EB (hex). Each subnet is given an ID of 0×FC and each node ID is set to 0×7A. These numbers are chosen to be less likely to conflict with other nodes that may already exist on a channel under test.

Figure 23:
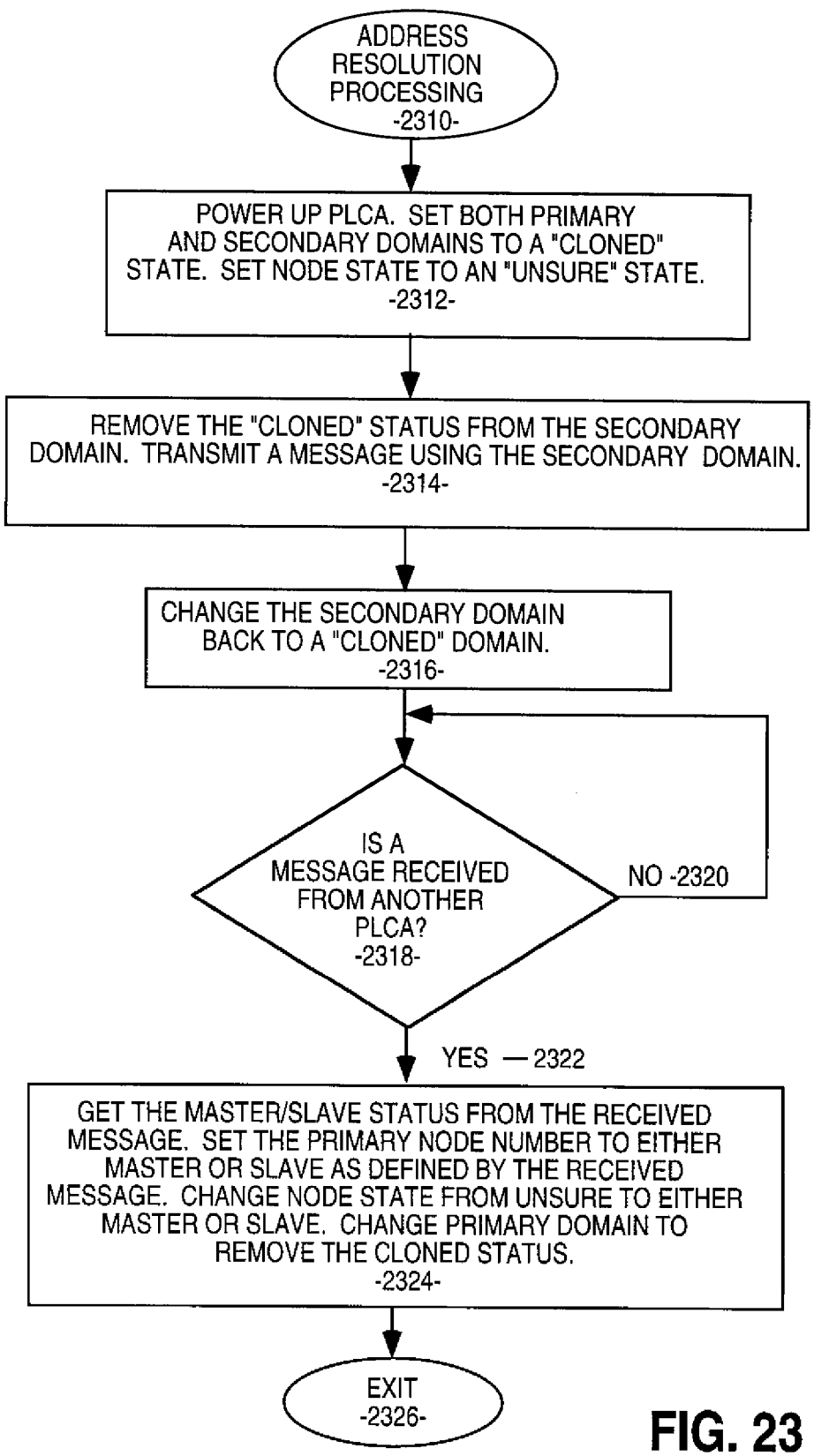

The processing performed by a node during the address resolution phase of initialization is illustrated in FIG. 23 starting in bubble 2310. After any power-up of a PLCA device, both domains of the device are defined to be cloned domains (receptive state active). This definition allows a node to receive messages from another unit with the same address as itself. This is not an error condition as long as the receiving node is not transmitting. A node with cloned domains is said to be in an UNSURE state (processing block 2312).

When a node is in an UNSURE state, the node attempts to communicate using the secondary domain. Before transmitting, the secondary domain has its "cloned" status removed (unreceptive state now active). This ensures that the transmitting unit rejects duplicate messages reflected back to itself. Upon completion of a transmission in the secondary domain (either successful or not), the secondary domain is changed back to a cloned domain (receptive state again active). This allows the node to be receptive to messages being initiated by other units in the UNSURE state. (Processing block 2316) If at any time a unit receives a message from another PLCA, it sets its primary node number to be either 0×7B (MASTER) or 0×7C (SLAVE) as determined by the control message (every control message contains MASTER/SLAVE status that the transmitter expects the receiver to have). It also leaves the UNSURE state and enters either the MASTER or SLAVE state. It also changes the primary domain to no longer have "cloned" status. (Processing block 2324). This completes the address resolution process of the present invention. Once the process is completed, the primary domain is used until power to one of the PLCAs is interrupted or until a control transaction failure occurs.

LCD Display Updates

The transmitted packet count and lost packet count are updated rapidly on both the sender and receiver units. The standard method for updating a count on an LCD display is to maintain a binary integer representation in memory, convert it to ASCII before displaying it, and then display the string. This method would consume too much real-time to work in this application, both in terms of converting binary to ASCII and in terms of updating a 7-character display entry.

Figure 24:
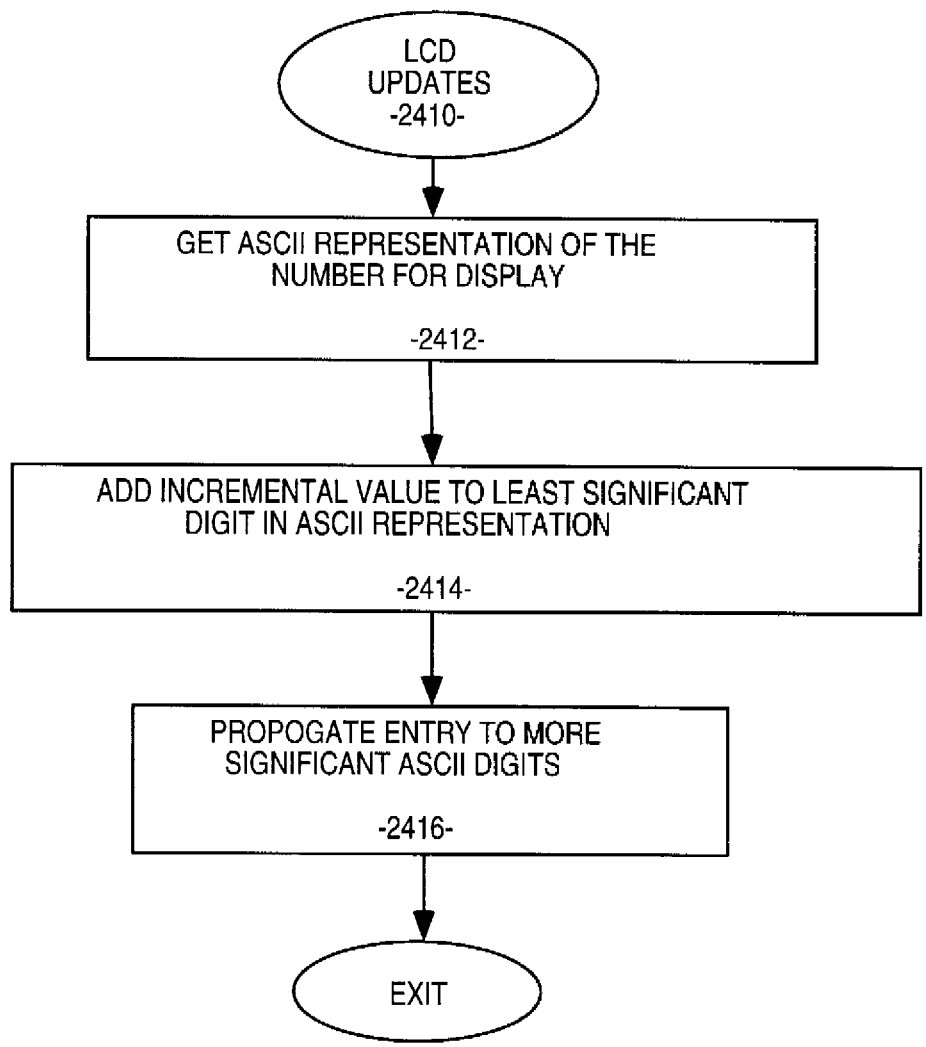

Therefore, an alternate method is used as illustrated in FIG. 24. In addition to a binary representation of the packet counts being maintained, an ASCII representation of the number is maintained as well. When the number changes, the ASCII representation is also changed by adding the incremental value to the least significant digit in the ASCII representation and propagating any carry to the more significant digits. Then, only those digits which changed in the ASCII representation are updated on the display. Typically, when data packets are being received and the count is being incremented by one, 90% of the time this update only affects a single digit, specifically, the least significant digit.

LED Display Processing

Figure 25:
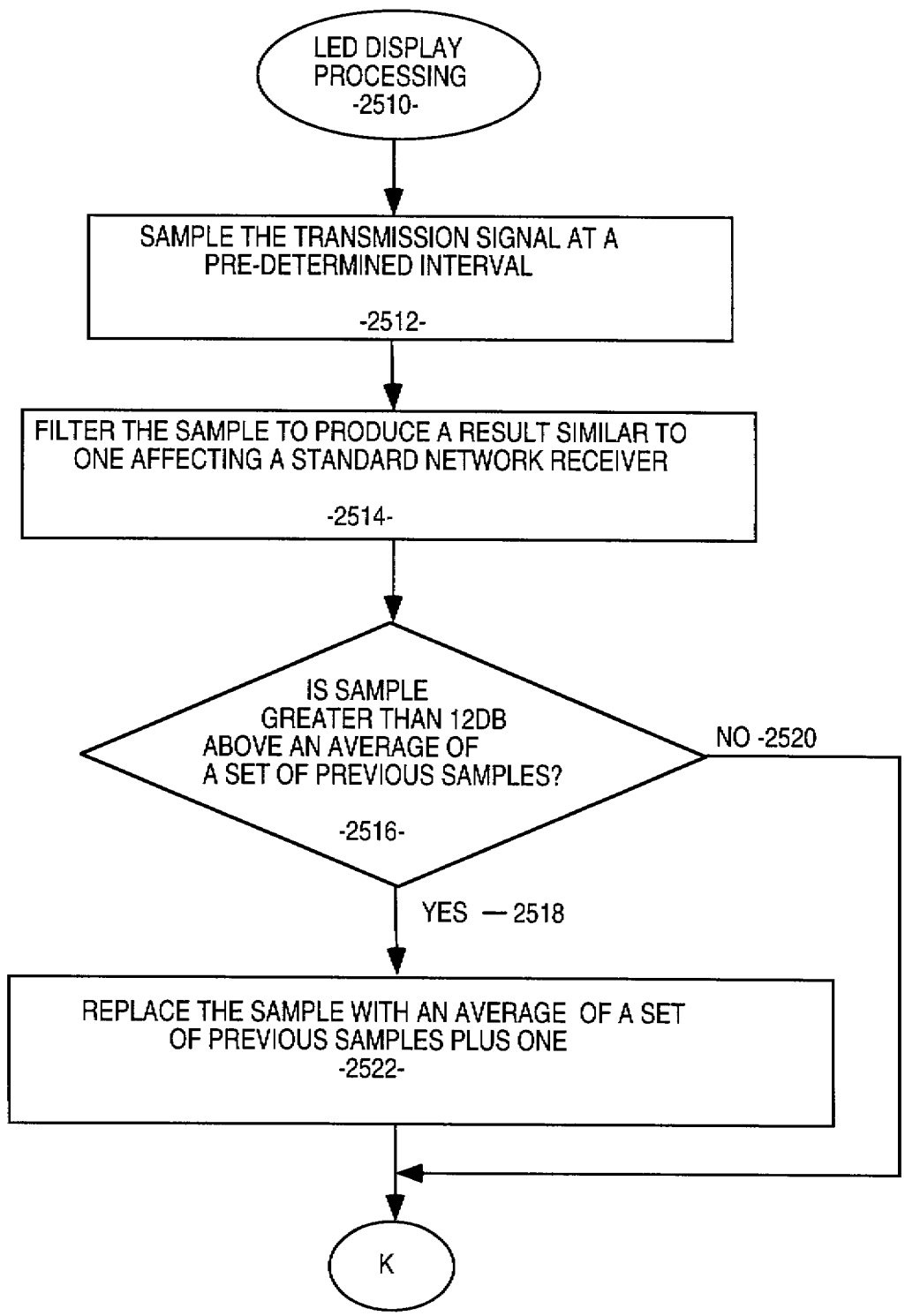

As illustrated in FIGS. 25 and 26, control logic 310 includes logic for processing the network transmission signal for display on a plurality of LED display elements 344. The receive data signal (transmission signal) is tapped from the receive circuitry within transceiver 312 of the PLCA and fed into an 8-bit digital to analog converter. The output of the converter is sampled by the control logic 310 at 51 microsecond intervals in the preferred embodiment. Each sample is filtered in two ways to mimic the noise-rejection characteristics of the transceiver's receiver section. First, samples which may include transient noise spikes are rejected by comparing them with the average of the previous two samples. If the current sample is greater than or equal to 12 dB stronger than the average of the previous two samples, the current sample is replaced with the average of the previous two samples plus 6 dB. The addition of 6 dB is necessary to prevent non-transient signals from being rejected.

The resultant data stream is then further filtered by averaging four samples at a time. The average value is updated with each new sample as follows: when a new sample arrives, the oldest sample is discarded and a new average is calculated.

The result of the average is then displayed on the LED display as follows: each new average is compared with a previously held value. If the new average is greater than or equal to the held value, the held value is replaced with the new average and a 200 millisecond timer is reset. If the 200 millisecond time expires (that is, if the held value is not replaced by a new average for 200 milliseconds) the held value is decremented by one until it reaches zero. After the 200 millisecond timer expires, its time is set to 50 milliseconds. The held value is decoded by a priority decoder which lights every LED that is equal to or less than the current held value. The net result of this processing is that the LED display acts as a peak-hold display which holds each peak for 200 milliseconds before shutting off the LEDs one at a time at 50 milliseconds per LED.

Martin Testing

The PLCA units of the present invention allow the user to quickly characterize a power line communication environment. The characterization process can be broken into two parts: margin testing and impairment identification.

Before using the PLCA units, it is important to verify that no other power line communication systems are being used on the power line under test. The presence of such devices can be easily detected by observing the Packet Detect LED on a PLCA unit when no packets are being transmitted. The Packet Detect LED will only flash when a power line packet is received: it is uncommon for noise to activate this LED.

Margin testing is performed by using the transmit attenuation feature of the PLCA unit. Testing is started by testing a communication path initially without transmit attenuation (TXATT=0). Then, after establishing that the packet error rate is acceptable, the transmit attenuation is increased from 0 to 6, 12, 18, and then 24 dB until the packet error rate is no longer acceptable. The greater the attenuation level required to reach the error rate limit, the greater the operating margin. Transmit attenuation testing combines signal attenuation testing, noise level testing, and signal distortion testing into one simple, practical test. Note that power line communication reliability is not symmetrical, so that the ability to communicate from sender analyzer to receive analyzer is not indicative of the ability to reliably communicate from receiver to sender. For this reason it is important to perform margin testing in both directions.

An acceptable performance level for communications on a power line is that it should have at least 6 dB of margin, and preferably 12 dB. For applications on unpowered wire pairs (twisted pair wire or unpowered telephone lines), 6 dB of margin is usually adequate.

Impairment Identification

After using margin testing to identify a problematic communication path, the next step is to identify the nature of the communication impairment. Unreliable communication on a power line is generally the result of a combination of three electrical effects, any one of which may be the dominant factor impairing communication. These effects include signal attenuation due to transmission losses and loading of the power line, noise as seen by the receiver due to equipment connected to the power line, and distortion of the transmitted packet. The PLCA unit has features designed to help determine which of these effects is most responsible for impaired communications. Once the nature of the impairment has been identified, proper corrective action can be taken.

The signal strength meter of the PLCA unit is the primary tool used for identifying the nature of impairments. Two measurements are necessary for isolating the type of impairment: the signal level at the receiver when packets are being transmitted, and the signal at the receiver when no packets are being transmitted (also referred to as the noise level). The arithmetic difference between these S/N ratio is calculated as the signal level at the receiver minus the noise level at the receiver. For example, in an environment with a large communications margin, the signal level at the receiver might be −12 dB while the noise level at the Receiver might be −36 dB, yielding a S/N of −24 dB.

The dominance of signal attenuation as a factor can be ascertained by observing the signal strength meter at the receiver while a test is running. Attenuation is likely the dominant impairment if the received signal level is −42 dB or less. On the other hand, if there is a large observed noise level (−30 dB to −6 dB) when no packets are present and the S/N is less than or equal to −6 dB, then a noise source close to the receiver is likely the dominant impairment.

In rare cases communication may be impaired when a S/N greater than 6 dB is observed at the Receiver. The observation of a good signal-to-noise ratio in conjunction with impaired communications is indicative of packet distortion by an uncommon power line transmission characteristic. The above conclusions are summarized in the following table.

| Rec. Signal Level | Rec. Noise Level | S.N | Dominant Impair. |
|---|---|---|---|
| ≦−42 dB | | | Signal attenuation |
| | >−30 dB | ≦6 6 dB | Noise source |
| | | >6 dB | Signal distortion |

Thus, a power line communications analyzer providing signal strength metering and selectable attenuation functions is described. Although the present invention is described herein with reference to a specific preferred embodiment, many modifications and variations therein will readily occur to those of ordinary skill in the art. Accordingly, all such variations and modifications are included within the intended scope of the present invention as defined by the following claims.

We claim:

1. A communication analyzer for measuring a signal quality of a transmission signal over a communications network, said communication analyzer comprising:

control logic for measuring a signal strength of said transmission signal and a noise level present on said communications network, said control logic also for determining an operating margin between said signal strength of said transmission signal and a minimum transmit signal strength required for reliable communication on said communications network over said noise level; and a transmitter logic for generating and transmitting data packets in said transmission signal on said communications network, said transmitter logic including logic for generating and transmitting control messages on said communications network, said control messages including a control message for dynamically selectively setting a parameter on a remote communication analyzer coupled to said communications network, said parameter including information to dynamically configure said remote communications analyzer in one of a transmit mode and a receive mode, said parameter being dynamically selectively set based on said operating margin determined by said control logic.

2. The communication analyzer as claimed in claim 1 wherein said parameter includes information to configure an attenuation level of said transmission signal.

3. The communication analyzer as claimed in claim 1 wherein said communications network is a power distribution network.

4. The communication analyzer as claimed in claim 3 wherein said parameter includes information to configure an attenuation level of said transmission signal.

5. A system for adjusting communication quality on a communications network, said system comprising:

control logic for measuring a signal strength of a communication signal and a noise level present on said communications network, said control logic also for determining an operating margin between said signal strength of said transmission signal and said noise level; and transmitter logic for transferring information to another system coupled to said communications network, said information including information to dynamically configure said another system in one of a transmit mode and a receive mode, said information to dynamically configure said another system being dynamically selectively set based on said operating margin determined by said control logic.

6. The system as claimed in claim 5 wherein said communications network is a power distribution network.

7. The system as claimed in claim 6 wherein said information includes information to configure an attenuation level of said communication signal.

* * * * *